United States Patent [19]

van Bavel

[11] Patent Number: 5,432,352
[45] Date of Patent: Jul. 11, 1995

[54] ION BEAM SCAN CONTROL

[75] Inventor: Marcus van Bavel, Elgin, Tex.

[73] Assignee: Eaton Corporation, Cleveland, Ohio

[21] Appl. No.: 193,436

[22] Filed: Feb. 8, 1994

Related U.S. Application Data

[63] Continuation-in-part of Ser. No. 123,148, Sep. 20, 1993, abandoned.

[51] Int. Cl.[6] .............................................. H01J 37/20
[52] U.S. Cl. ............................ 250/492.21; 250/440.11
[58] Field of Search ............. 250/492.2, 492.1, 492.21, 250/442.11, 440.11, 492.3

[56] References Cited

U.S. PATENT DOCUMENTS

| | | | |
|---|---|---|---|
| 4,125,828 | 11/1978 | Resnick et al. | 250/461.2 |
| 4,749,867 | 6/1988 | Matsushita et al. | 250/442.11 |
| 5,229,615 | 7/1993 | Brune et al. | 250/492.2 |
| 5,262,651 | 11/1993 | Frazier et al. | 250/492.2 |
| 5,323,012 | 6/1994 | Auslander et al. | 250/492.2 |
| 5,326,979 | 7/1994 | Kawasaki et al. | 250/492.2 |

OTHER PUBLICATIONS

Ray, A., Dykstra, J. & Simonton, R., "Overview of Eaton NV-8200P High Beam Purity, Parallel Scanning Implanter." To the best of Applicant's knowledge, this article was presented at a conference on Sep. 21, 1992 in Gainesville, Fla.

Primary Examiner—Jack I. Berman
Assistant Examiner—James Beyer
Attorney, Agent, or Firm—Watts, Hoffmann, Fisher & Heinke

[57] ABSTRACT

A scan control for use with an ion implantation system. A servo motor having an output shaft scans a wafer support through an ion beam to controllably treat the wafer. A digital signal processor monitors an encoder output corresponding to motor shaft orientation and compares this position with a desired position of the wafer support. An error signal modifies a motor energization signal based on this comparison. Velocity damping based upon sensed motor speed and wafer support speed smooths the scan motion via a second motor energization correction.

16 Claims, 27 Drawing Sheets

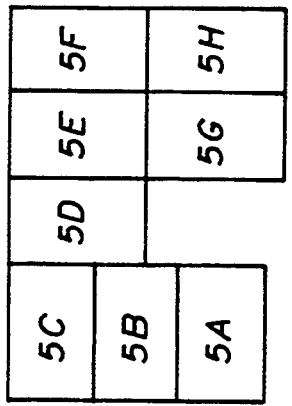
FIG. 5
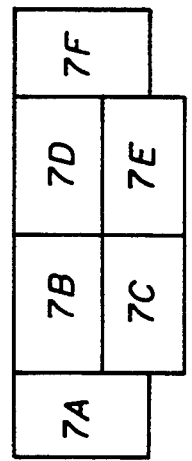
FIG. 7
FIG. 8
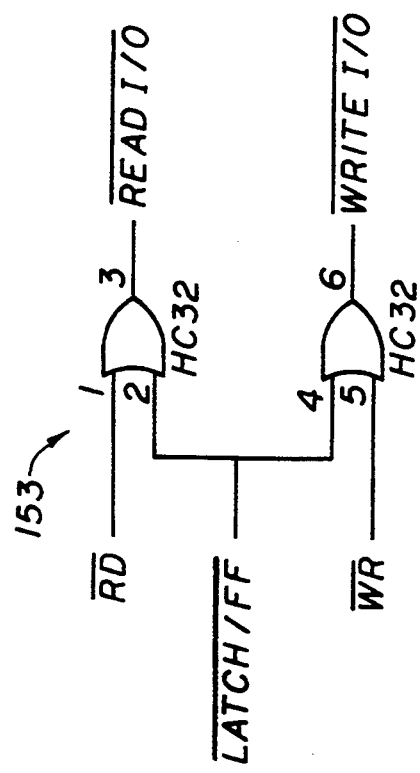
FIG. 6
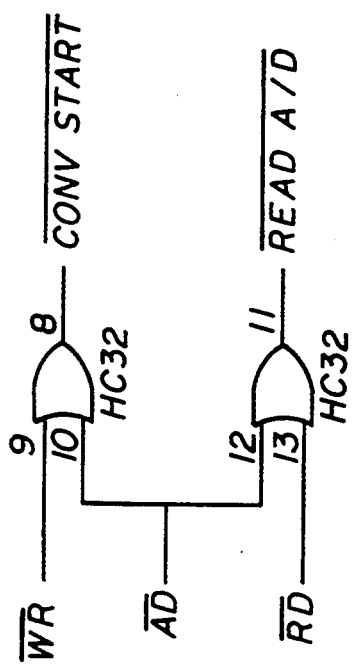

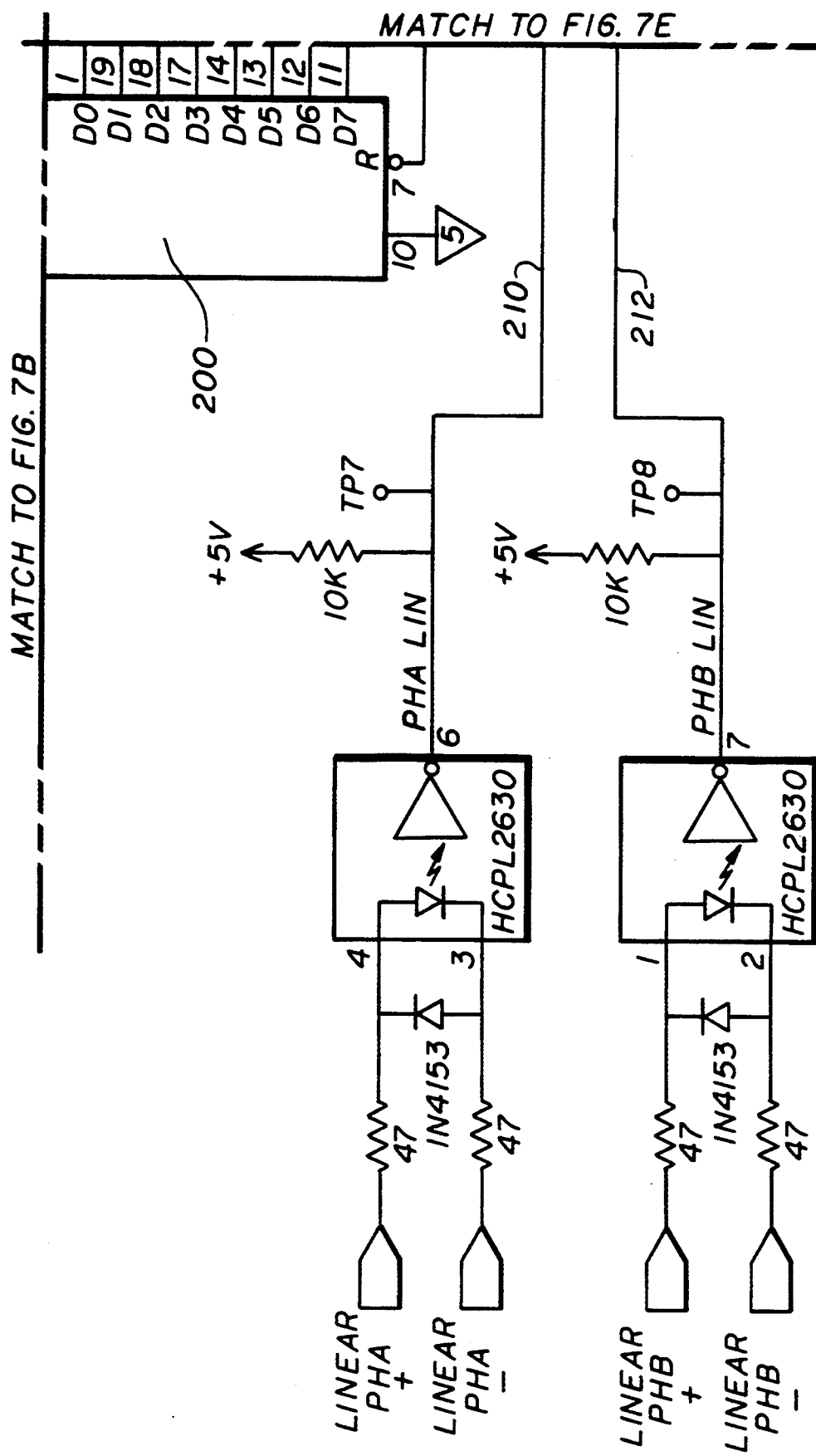

ION BEAM SCAN CONTROL

RELATED APPLICATION

The present application is a continuation-in-part of application Ser. No. 08/123,148, filed Sep. 20, 1993, now abandoned, entitled "Ion Beam Scan Control."

TECHNICAL FIELD

The present invention relates to an ion beam implantation system and more particularly relates to method and apparatus to scan a circular wafer through an ion beam to treat the wafer. In a most typical application of the invention, the wafer is made of silicon and the result of the ion beam scanning of the wafer provides a semiconductor wafer that can be further processed to form an integrated circuit.

BACKGROUND ART

One technique for doping semi-conductor wafers is to direct a beam of ions to impinge upon such a wafer to produce controlled concentrations of doping impurities within the wafer. An important parameter of a semiconductor wafer ion implant process is the spatial uniformity of the implanted dose across the wafer. Another important parameter is the angle of incidence of the ion beam with respect to the wafer and internal lattice structure of the silicon crystal (or GaAs lattice or other crystalline substrate). The angle of incidence is important because of the role it plays in the phenomenon of channeling. Dopant depth profiles vary as a function of position on the wafer surface if the incident angle of the beam varies across the surface.

In medium and low current ion implanters, the ion beam is commonly directed across the wafer surface by deflection scanning of the beam in a controlled pattern. This has commonly been done using two orthogonal pairs of electrostatic deflection plates or electrodes to produce the beam deflections. Application of a triangular waveform voltage to the plates can produce rectangular raster scan patterns on the wafer. U.S. Pat. No. 4,514,637 to Dykstra et al. discloses one such medium to low current ion implanter.

Electrostatic ion beam deflection scanning results in different angles of beam incidence at different locations on the wafer surface. This is the source of a major depth nonuniformity (from the resulting channeling variations) which occurs in this type of implanter.

High current implanters move the wafer through a stationary beam by mechanical means such as attaching the wafers to a spinning disk passing through the beam or other well-known mechanical scanning techniques. These mechanical scanners have tended to be designed so that as the wafer moves through the ion beam, the angle of beam incidence remains constant or nearly so. For this reason, mechanical scanning of wafers through a stationary beam has come to be considered as a superior method to x-y deflection of the beam for producing depth uniformity and minimum mask shadows variation.

Batch wafer handling imposed by the high current ion beam techniques have generally resulted, however, in reduced wafer throughput and required large costly wafer handling stations. Deflection scanning machines on the other hand have advantages in size, simplicity and cost, but suffer from varying angle of beam incidence problems.

To help eliminate the effects of channeling, the wafer is tilted at an angle relative to the incident beam. The wafer tilt causes the beam velocity to be lower (higher dose) for areas of the wafer closer to the source and beam velocities to be higher (lower dose) for areas of the wafer farther from the source.

Recently issued patents relating to ion beam scanning systems for medium current implanters are U.S. Pat. No. 5,177,366 to King et al., U.S. Pat. No. 5,160,846 to Ray, and U.S. Pat. No. 5,091,655 to Dykstra et al. which are assigned to the assignee of the present invention. These patents concern an ion implantation system that controllably sweeps the ion beam back and forth in a plane. The deflected ions pass through a lens that redeflects the ions so that the ions follow generally parallel paths and form a thin ion beam through which a wafer is scanned along a linear implantation path.

The present invention concerns a control for scanning the wafer support and wafer through an ion beam. One system for achieving a back-and-forth scan of a wafer support is disclosed in U.S. Pat. No. 5,229,615 to Brune et al. which is incorporated herein by reference.

DISCLOSURE OF THE INVENTION

The present invention includes an ion implant controller for monitoring and controlling a wafer scan through an ion beam. A preferred system includes a side-to-side beam scanning system such as the system disclosed in the aforementioned '366 patent to King et al. Such a system includes a thin ion beam where ions within the cross section of the beam impact a wafer at generally parallel, uniform angles. A motor coupled through a transmission to a wafer support scans the wafer back and forth through this thin ion beam in a controlled manner to achieve controlled doping of the wafer.

A controller included within the ion implantation system activates the motor to scan the wafer through an ion beam in accordance with a controlled trajectory determined from ion beam intensity. Sensors monitor a position of the motor shaft during the ion implantation and provide a first position signal used by the controller. A position of the wafer support is also monitored by a linear encoder to provide a second position signal. The controller also maintains a target position signal which is periodically updated as the scan continues. This target position signal is compared with the motor shaft signal and used to create a position error signal for continued energization of the motor.

As the motor scans the wafer support through the ion beam, instantaneous shaft velocity and wafer velocity determinations are made based upon the encoder signals and used to damp vibrations in the wafer support. A damping factor is calculated by the controller and used to adjust the signal that energizes the motor to minimize vibration of the wafer support.

While prior art scan controls use a generally trapezoidal velocity profile which ramp up to a constant velocity and then ramp back down from the constant scanning velocity to a rest state, the present invention defines a scan trajectory which gradually accelerates the motor and eliminates sharp discontinuities in the velocity profile. In addition, the velocity profile can be updated based upon the ion beam intensity so that during each scan a new preferred travel speed can be calculated and used to determine incremental scan positions. Each calculation causes an updated series of desired position points along the travel path to be stored in memory and used during calculation and updating of the motor energization signal.

The transmission coupling the motor to the wafer support has a nonlinear aspect near its end of travel. This is due to the geometry of the scanning system which converts rotational motion of the motor into the transverse displacement of the support. To compensate for this nonlinearity, the motor controller performs an initialization process which stores positions in an internal table that is accessed during motor energization.

It is seen that a combination of factors including ion beam current, scanning geometry, avoidance of sudden accelerations and decelerations all contribute to a preferred scanning profile which is calculated by the controller and used in activating a scanning motor. These and other objects, advantages and features of the invention will become better understood from the following detailed description of a preferred embodiment of the invention.

BRIEF DESCRIPTION OF THE DRAWINGS

FIG. 6 is a schematic showing control signals used to read and write to integrated circuits depicted in the FIG. 5 schematic;

BEST MODE FOR PRACTICING THE INVENTION

Figure 1:
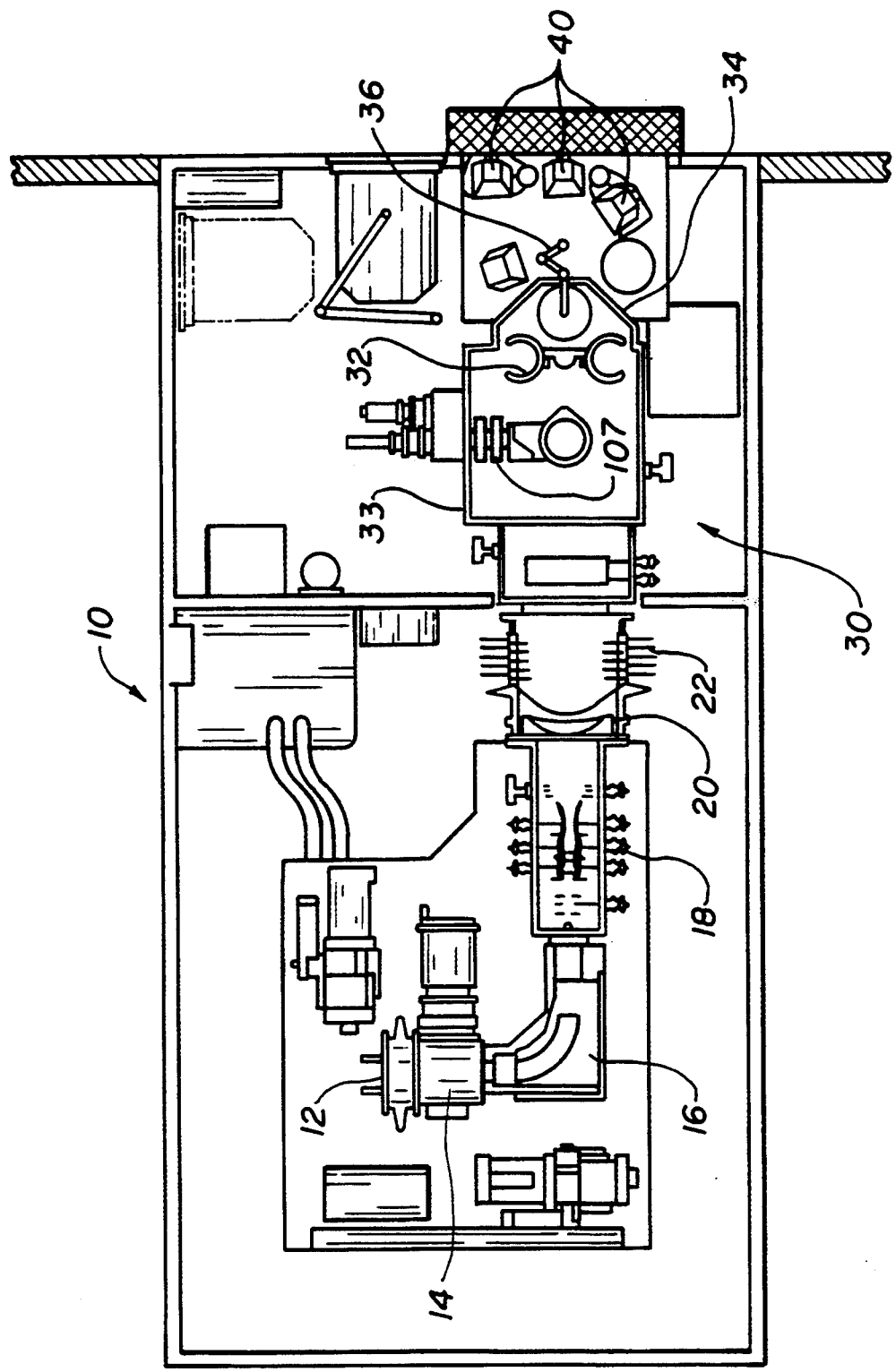
FIG. 1 is a schematic depiction of an ion implanter constructed in accordance with the invention.

Turning now to the drawings, FIG. 1 illustrates an ion implantation system 10 for treating semiconductor wafers such as silicon wafers used in integrated circuit fabrication. The system 10 includes an ion source 12 for emitting ions which are accelerated by an extraction assembly 14 and analyzed by a magnet 16. Ions traveling through the magnet 16 are bent by the magnetic field provided by the magnet and exit along an ion beam travel path bounded by electrodes 18 for achieving a side-to-side scanning of the ions within the ion beam. Downstream from the electrodes 18, ions pass through a lens 20 which redeflects the ions and directs them through an additional array of electrodes 22 for accelerating the ions to a final desired energy.

A beam end station 30 includes a wafer handler 32 inside an ion implantation chamber 33. The wafer handler 32 moves the wafers back and forth from a loadlock 34 for maintaining vacuum within the end chamber. A robot wafer handler 36 moves wafers from wafer cassettes 40 into the loadlock 34 where the wafer handler 32 individually moves wafers to a wafer support 42 (see FIG. 2). The wafer support 42 is mounted for multiple degrees of rotation and also mounted for linear translation to scan wafers attached to the wafer support 42 through the ion beam after the beam 44 enters the ion implantation chamber 33.

Figure 2:
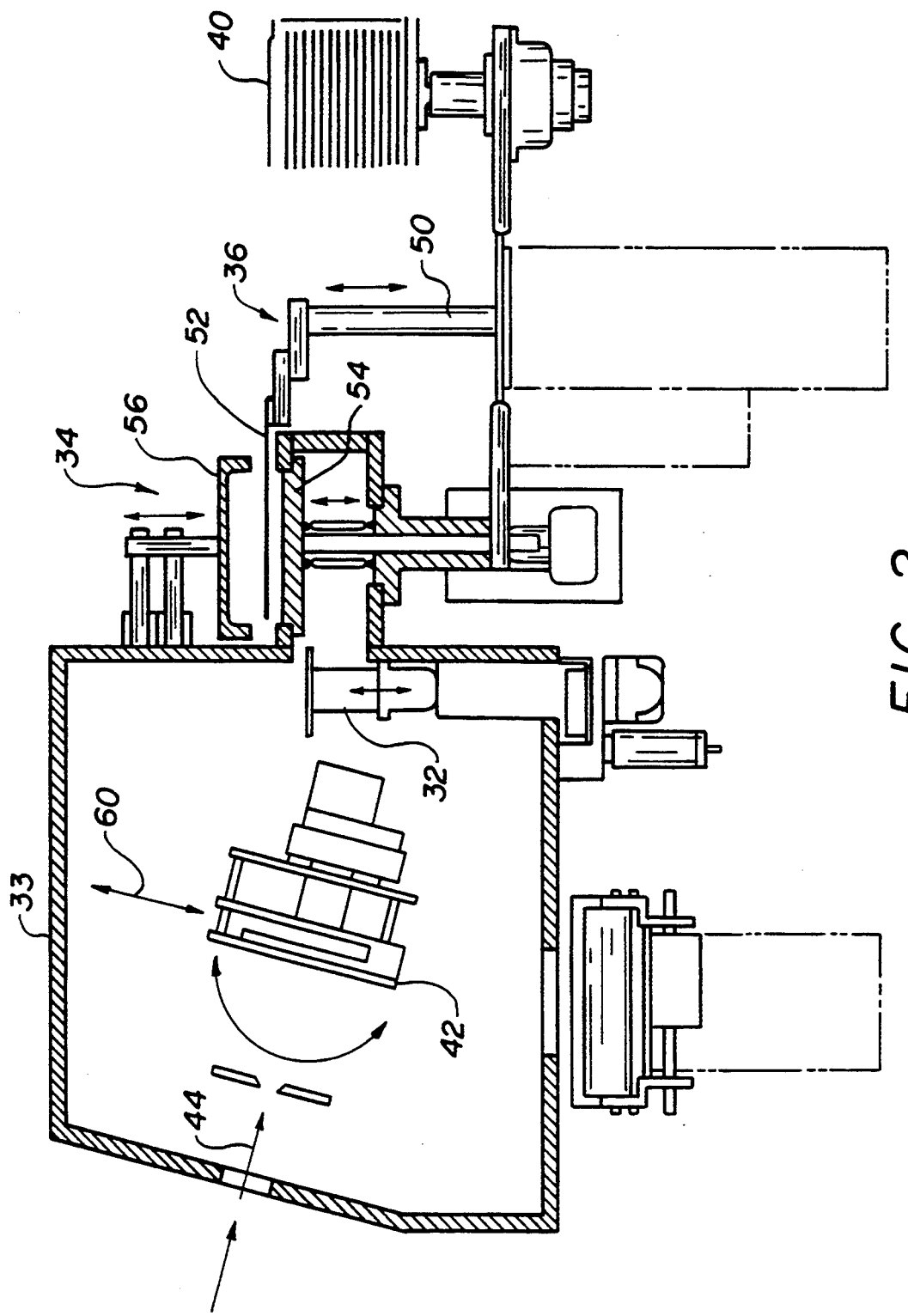
FIG. 2 is a side view showing a wafer support and loadlock for bringing wafers from atmospheric pressure into the evacuated region of an ion implantation chamber.

Turning to FIG. 2, this figure illustrates a representative cassette 40 having wafers stacked within the cassette. The robot 36 includes a pedestal support 50 which raises and lowers a robot arm 52. The arm 52 is inserted within the cassette 40 to extract a wafer and insert that wafer into the loadlock 34. The loadlock 34 defines a chamber having a movable base 54 and cover 56. The cover 56 is automatically raised by a loadlock motor (not shown) to allow the arm 52 to place a wafer onto the base 54. The cover is lowered and fluid in the loadlock pumped from the loadlock to allow a vacuum to be maintained in the implantation chamber 33. The base 54 is lowered to allow the wafer handler 32 to grasp and remove untreated wafers or alternately to deliver treated wafers to the base 54. Once an untreated wafer has been placed upon the wafer support 42, the wafer support is reoriented to allow the wafer to be impacted by the ion beam 44. Ions entering the implantation chamber 33 impact the wafer across a thin ribbon of approximately 0.50–0.75 inches. By scanning the support 42 back and forth through this ribbon, however, the entire surface of the generally circular wafer can be treated. This back-and-forth motion of the support 44 is depicted by the arrow 60 in FIG. 2.

Scan Electronics

Figure 3:
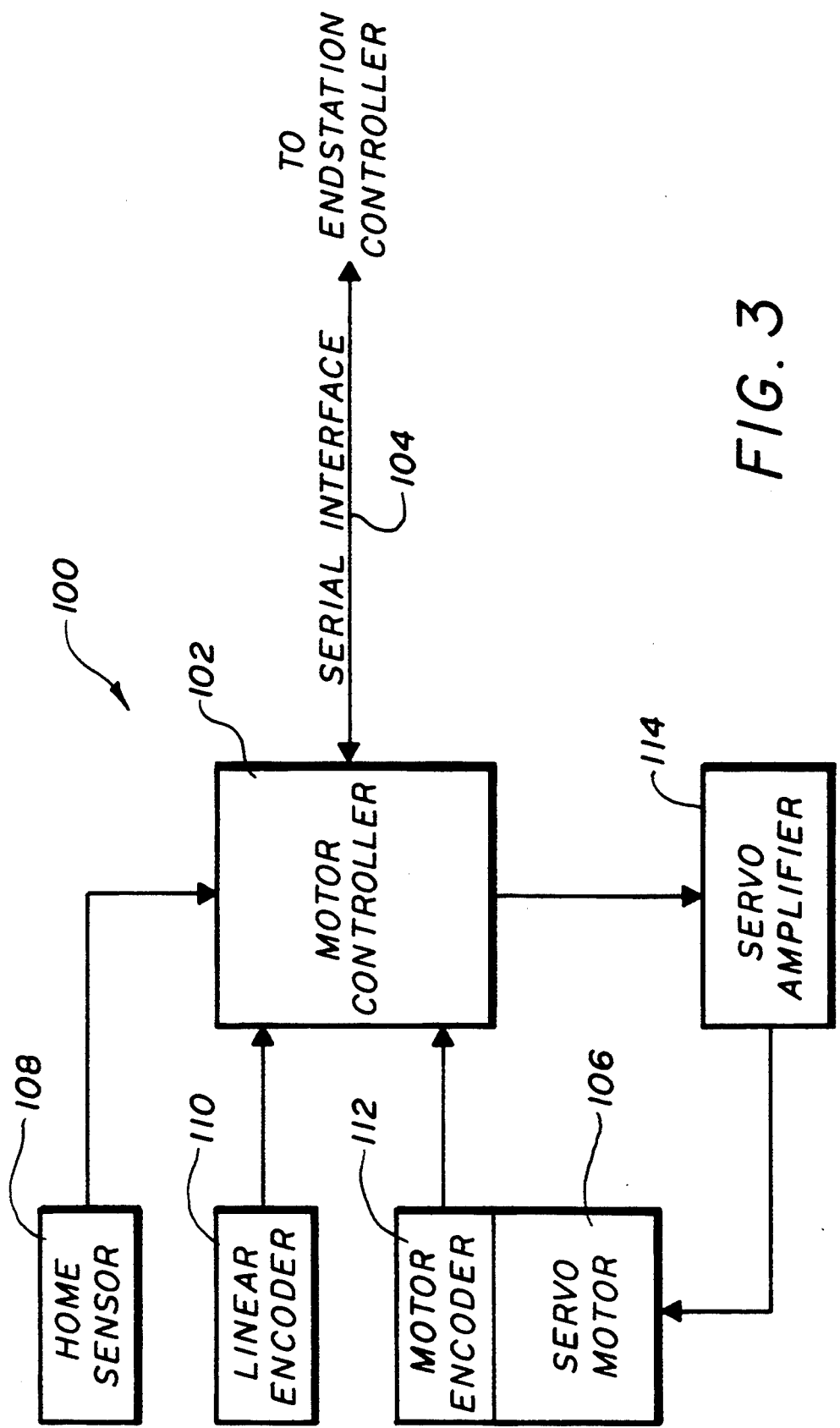
FIG. 3 is a schematic diagram showing a motor controller and sensors and interfaces for the controller.

FIG. 3 depicts a control circuit 100 that includes a programmable controller 102 having a serial interface 104 for communicating with an end station ion implantation controller (not shown) programmed through a user console. The controller 102 preferably includes a digital signal processor 105 (FIG. 5) programmed to monitor movement of the wafer support 42 as well as monitor the shaft orientation of a servo motor 106. The motor 106 is a brushless direct current motor having motor windings which, when energized, cause an output shaft coupled to a transmission 107 (FIG. 1) to move the wafer support along a linear scan path. The direction of scan can be reversed by reversing the polarity of the energization signals applied to the motor windings.

The motor controller 102 monitors outputs from a plurality of sensors 108, 110, 112 and produces a digital signal corresponding to the direction and amplitude of desired motor energization. This digital signal is coupled to a servo amplifier 114 for converting the output from the motor controller 102 into an analog signal appropriate for energizing the motor 106.

In accordance with a preferred motor energization format described below, the motor controller 102 determines the position of the wafer support 42 by monitoring the output of a linear encoder 110 which provides signals that allow the controller 102 to update the position of the support as the scan occurs. A home sensor 108 provides a signal when the support 42 is positioned in a home position. The motor controller 102 includes a control algorithm for driving the support to this home position and upon receipt of a home signal from the sensor 108, initializes an internal register where counts received from the encoder sensor 110 can be stored. As the motor is energized and the wafer support 42 moves back and forth through the ion beam 44, the encoder register is updated upon receipt of outputs from the encoder 110. The combination of outputs from the two sensors 108, 110 thereby provides the controller 102 a means of determining wafer support position.

The motor encoder 112 provides signals that allows the controller 102 to determine the shaft orientation of the motor 106 relative the home position orientation. Due to the fact that the transmission 107 coupling the motor 106 to the support 42 is flexible, the orientation sensed by means of the linear encoder 110 need not exactly correspond to the position of the motor encoder 112. The outputs from the two encoders 110, 112 are also used to determine motor speed and wafer support speed. As discussed below, the encoder signals are used to update the speed values which are in turn used to modify or adjust motor energization.

FIG. 5 illustrates details concerning the controller 102 and circuitry coupled to a digital signal processor 105 for monitoring signals generated by the sensors 108, 110, 112 as well as storing algorithms for controlled energization of the motor 106. The digital signal processor 105 is preferably a Model ADSP-2101 16-bit processor commercially available from Analog Devices. The processor operates at a clock speed of 12 megahertz provided by an oscillator circuit 116 (see FIG. 5C) and is coupled by means of an address bus 120 to memory circuits 122, 124, 126 (FIGS. 5D–5F) which store a computer program for monitoring the scan motion and performing controlled energization of the motor.

The memory circuits 122, 124, 126 also interface to a 24-bit data bus 130 (FIG. 5B) which allows program data to be extracted from the memory and accessed by the digital signal processing circuit 105. A watchdog timer circuit 132 (FIG. 5A) coupled to a reset input 134 of the digital signal processor 105 provides an automatic reset to the processor 105 in response to a failure in the processor control algorithm.

Figure 8A:
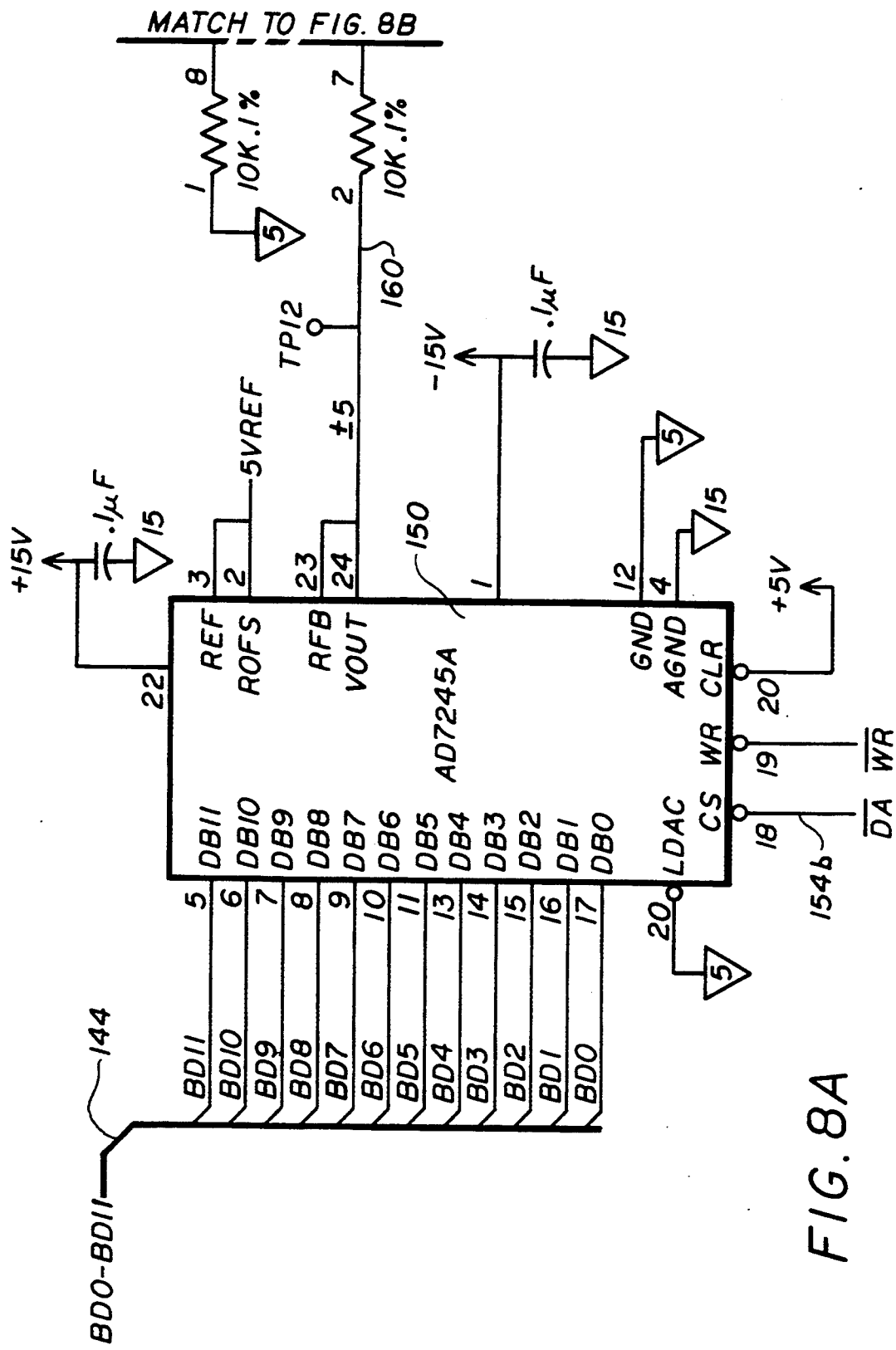
FIGS. 8A and 8B are a schematic depiction of a digital-to-analog convertor for converting digital control signals output from the digital signal processor of FIG. 5 into analog signals for energizing motor windings.
Figure 8B:
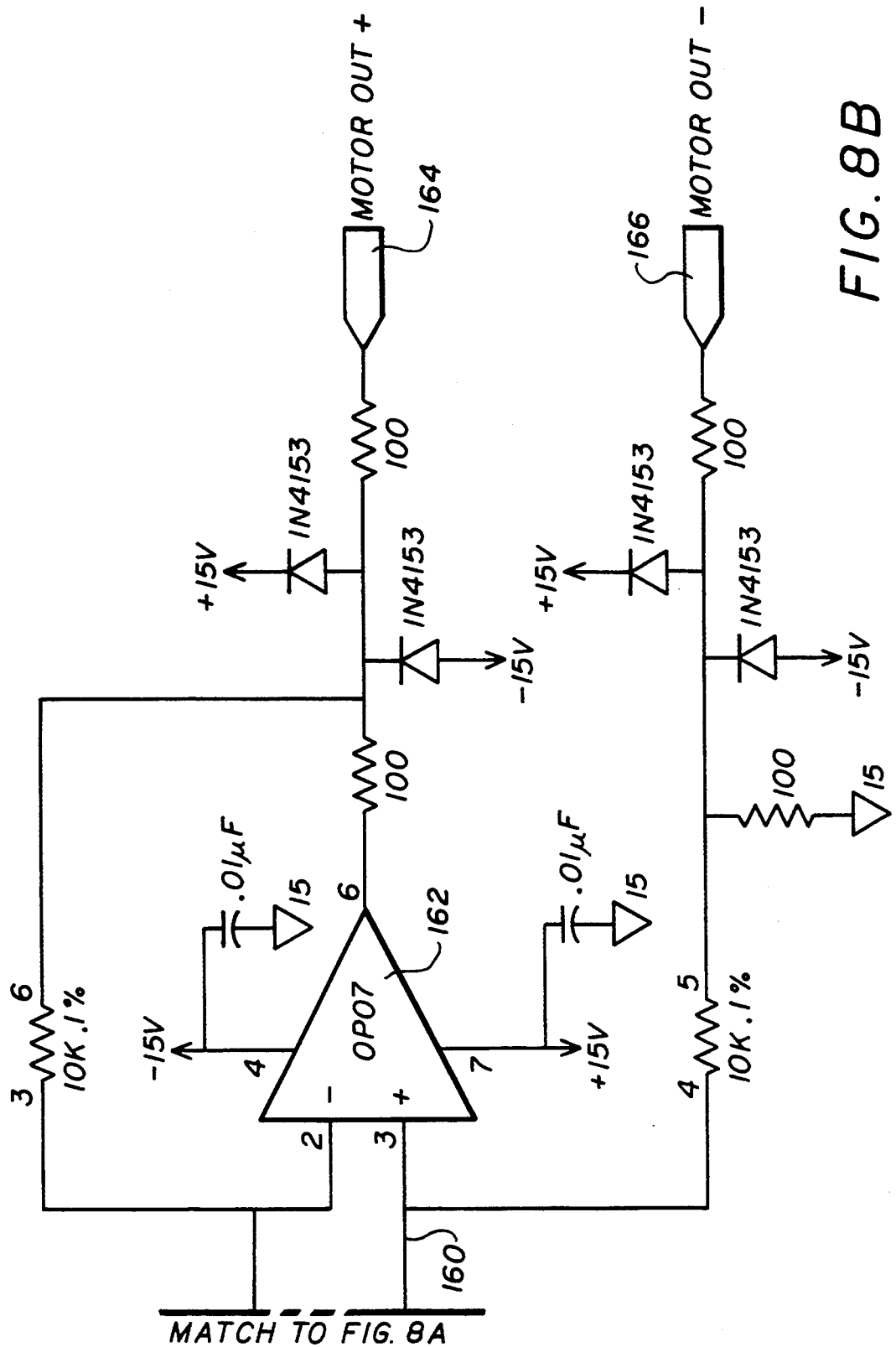

The data bus 130 provides digital signals to a pair of data buffers 140, 142 (FIG. 5H) which extract data from the data bus 130 and output data to a second, auxiliary 12-bit data bus 144 (DB0–DB11) coupled to a digital-to-analog convertor 150 (see FIG. 8). The controller 102 includes an address decoding circuit 152 coupled to the high four bits of the address bus 120. By selectively writing to the address bus and controlling the read (RD) and write (WR) pins coupled to a logic circuit 153 (FIG. 6), the digital signal processor 105 can activate one or more of the outputs 154 from the address decoding circuit 152. These outputs 154 are labeled in FIG. 5G. One output 154b is coupled to a chip select input of the digital-to-analog convertor 150 and is used to signal the digital-to-analog convertor 150 when to latch the data presented on the bus 144 and convert this data into an output 160 coupled to an amplifier 162 (FIG. 8B).

Two analog outputs 164, 166 from the digital-to-analog convertor are coupled to the servo amplifier 114 for activating the brushless DC motor used in providing scanning motion to the wafer support. The amplifier 162 provides an output 164 and a reference ground is provided at the output 166.

FIGS. 7A–7F illustrate an interface for the digital signal processor 105 by means of which the processor 105 can monitor the position of the scanning support, the position of the motor shaft, and communicate with the implantation controller by the serial interface 104. Two optical encoder interfaces 200, 202 (FIGS. 7B, 7E) are coupled to the data bus 130 and provide digital output signals corresponding to the position of the motor shaft and linear position of the wafer support, respectively.

Each of the encoder interfaces 200, 202 receives a series of pulses from an associated optically isolated phase quadrature input. The signal at two inputs 204, 206 to the encoder interface 200 constitutes two pulse trains having a timed relationship to each other based upon motor shaft rotation. The interface 200 interprets these pulses to update a position of the motor shaft as well as the direction of shaft rotation. In a similar way, the two inputs 210, 212 to the interface 202 allow the interface 202 to generate an output corresponding to the linear position of the wafer support 44 as well as the direction of movement of the wafer support.

Figure 7A:
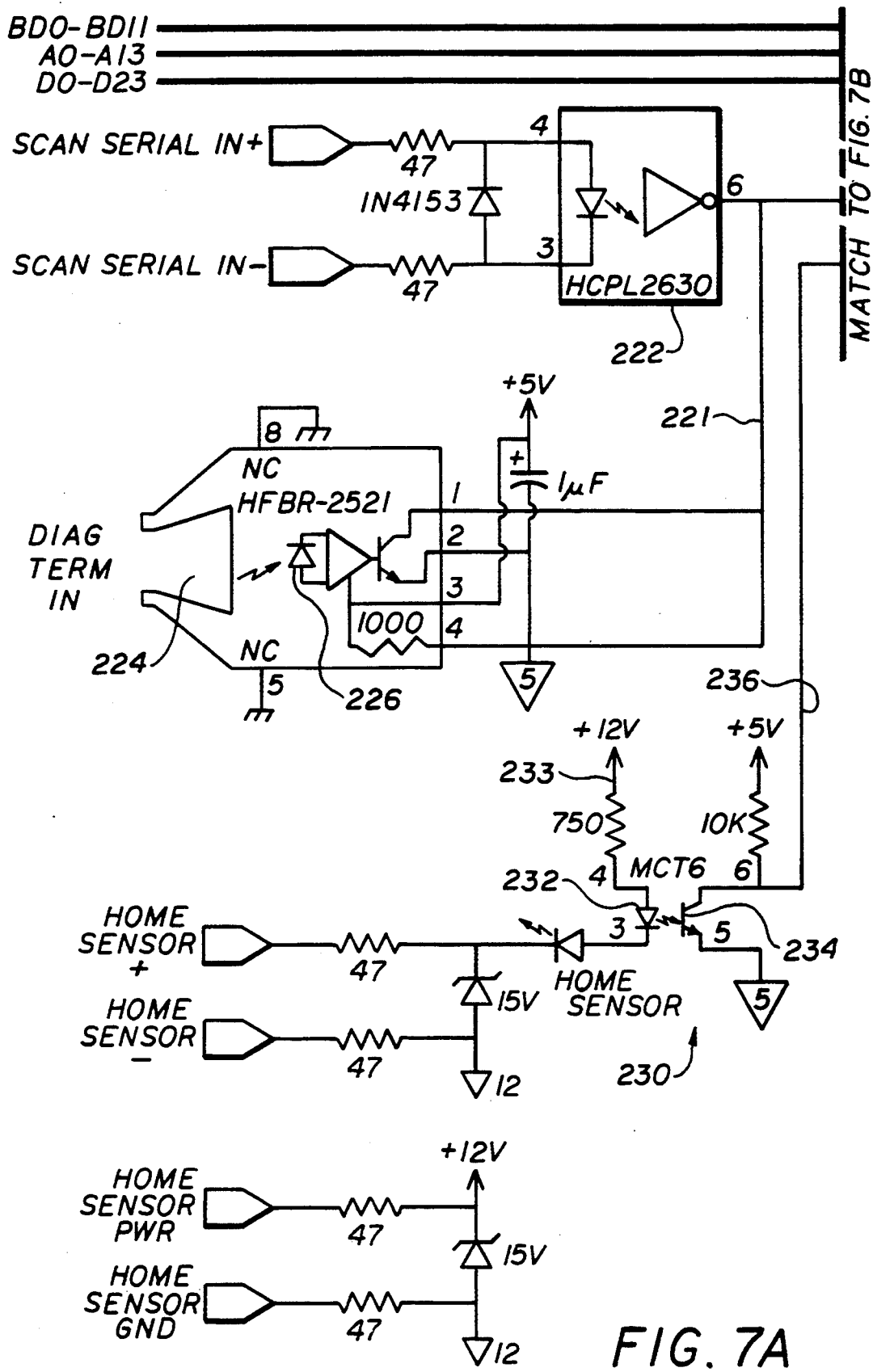
FIG. 7 is an overview of FIGS. 7A–7F which illustrate analog circuitry for monitoring performance of the motor and wafer support.
Figure 7B:
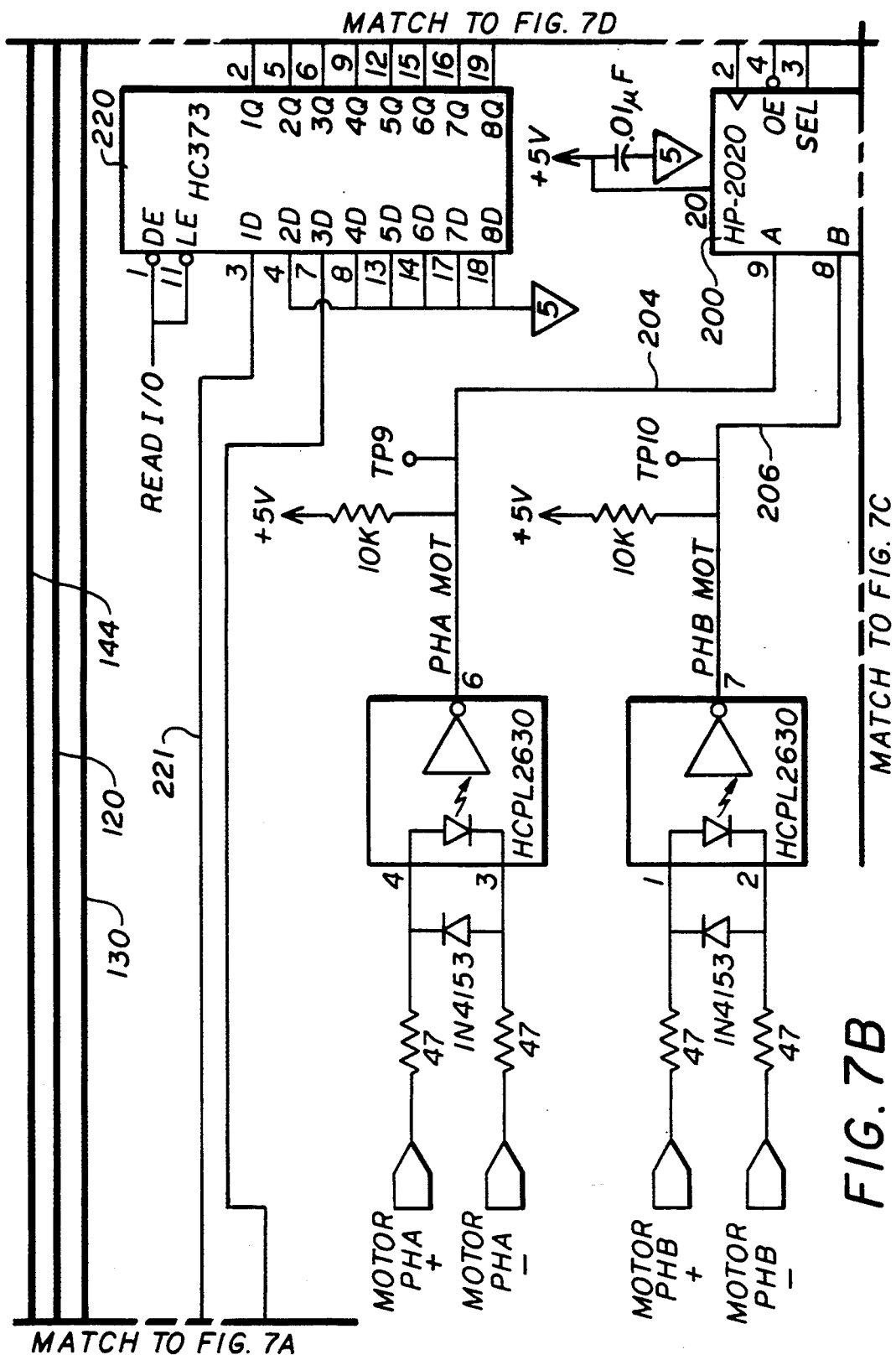
Figure 7D:
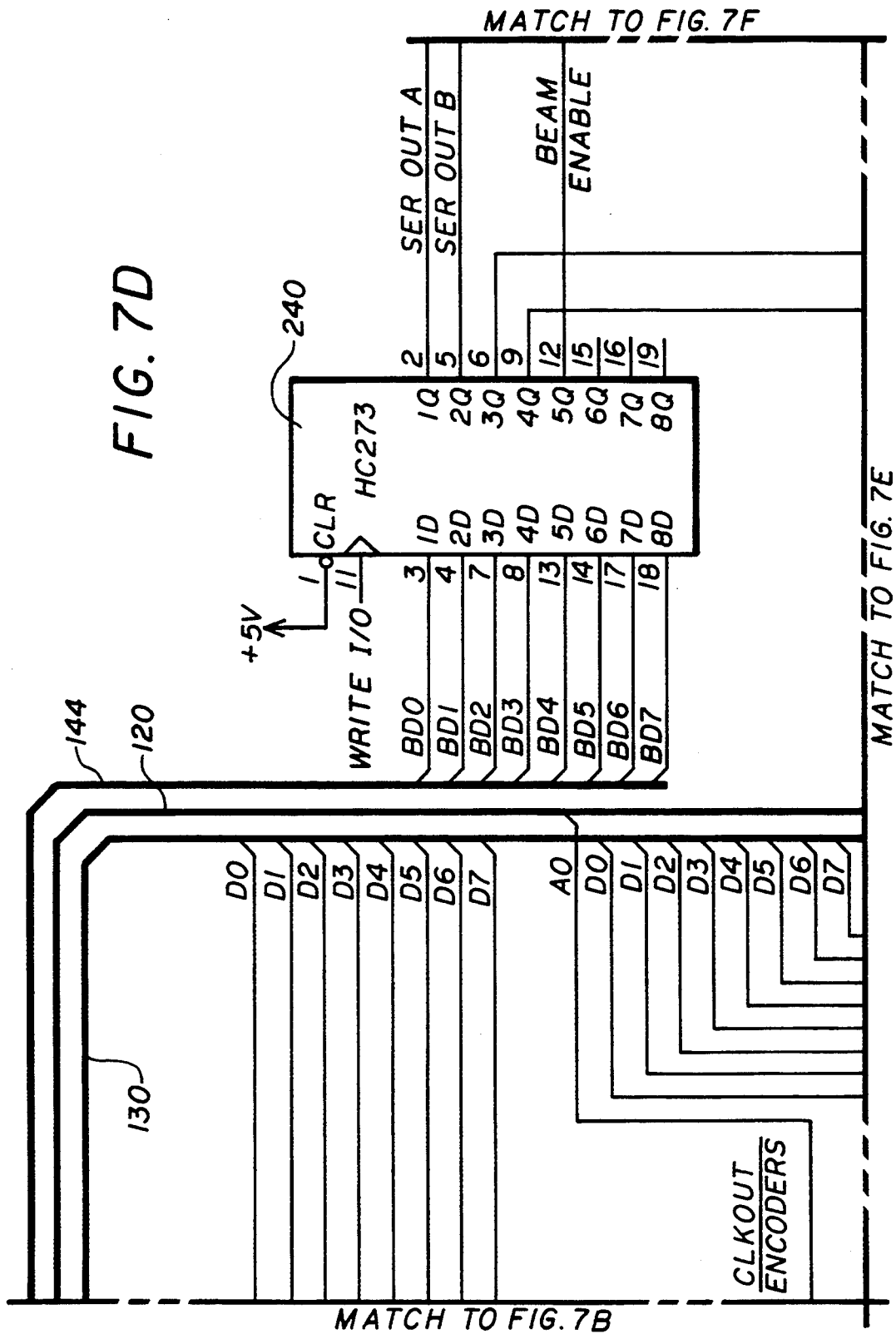
Figure 7E:
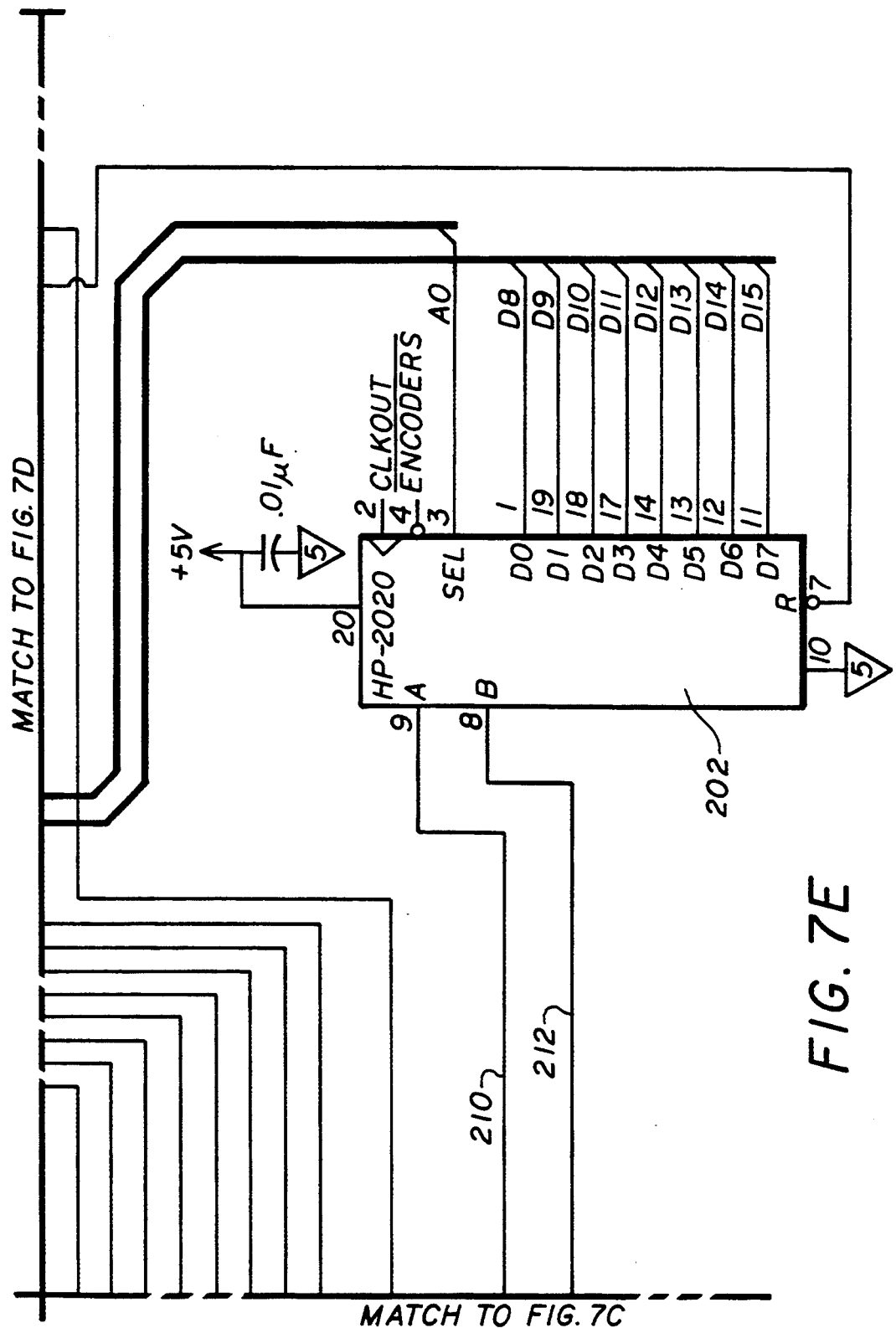
Figure 7F:
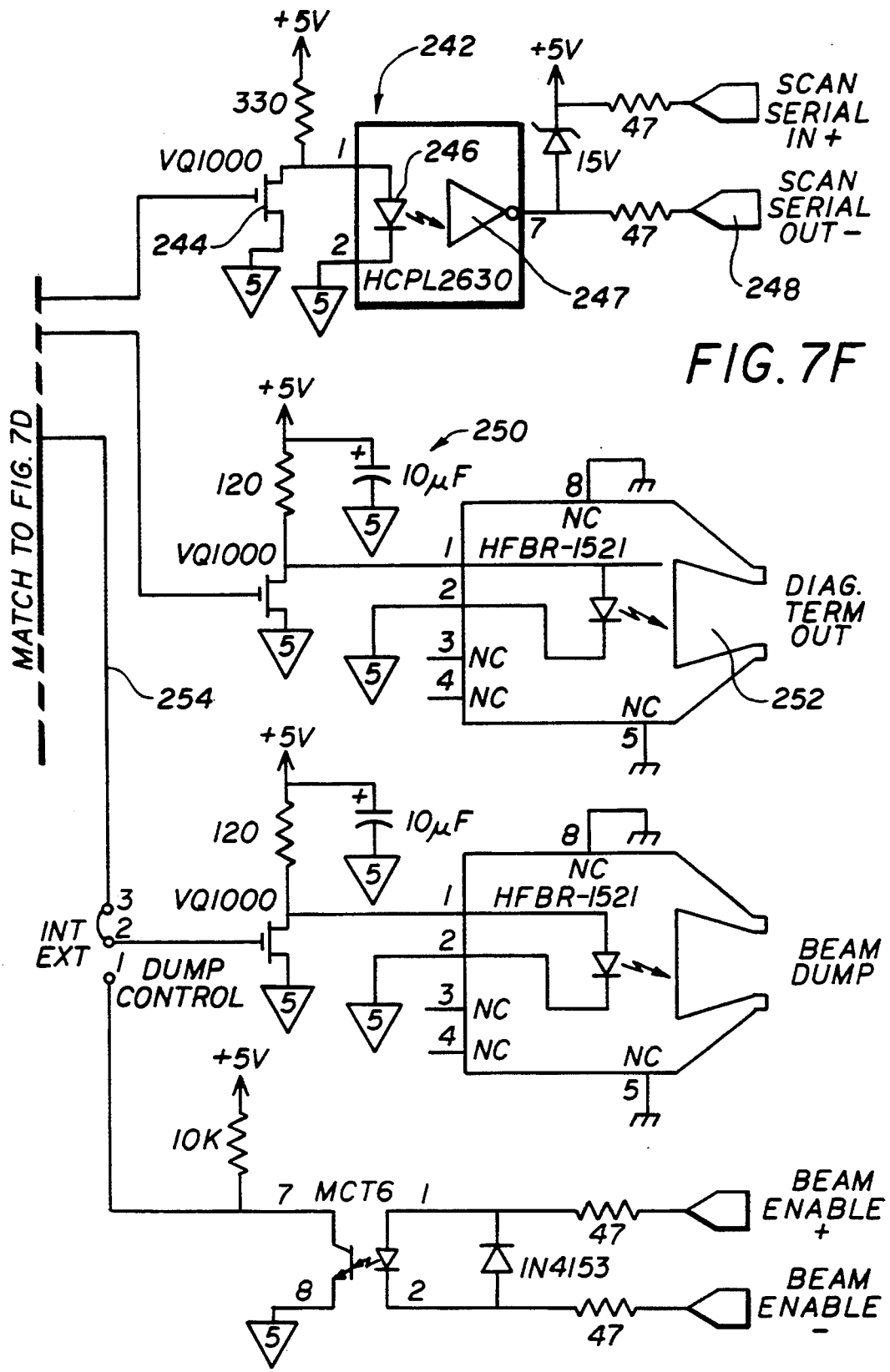

A latch circuit 220 shown in FIG. 7B interfaces with a serial transmission input 221 from the implant controller. The latch 220 responds to READ I/O control signals from the digital signal 105 processor to latch binary signals transmitted to the latch circuit 220 by means of an optical isolation circuit 222 (FIG. 7A) onto the data bus 130. The digital signal processor samples the latch input at a rate much higher than the baud rate of the serial communications at the interface. This assures that changes in state of the communication signals are monitored and the messages transmitted and correctly interpreted by the digital signal processor.

A second signal presented at the input 221 to the latch 220 originates from a diagnostic input used in diagnosing operation of the digital signal processor. A diagnostic fiberoptic input 224 directs light signals to a photodiode 226 which converts those signals into a serial digital communications signal at the latch 220.

An additional latch input is generated by a sensing circuit 230 (FIG. 7A) for monitoring a home position of the scan system. The optical sensing circuit 230 includes a photodiode 232 activated by a 12-volt supply 233. When the wafer support reaches a position that disrupts the light output from the photodiode 232, a phototransistor 234 responds by generating a signal on an input 236 which is sent to the data bus 130 by means of the latch 220.

An additional 8-bit latch 240 (FIG. 7D) coupled to the auxiliary data bus 144 sends serial communications to the end station controller by means of a circuit 242 (FIG. 7F) including a field effect transistor 244 which activates a light-emitting diode 246 monitored by a phototransistor 247 coupled to an output 248. A diagnostic output circuit 250 is also coupled to the latch 240 and creates a signal coupled to a fiberoptic output 252 for conducting diagnostic serial communications from the processor 105.

A beam enable output 254 (FIG. 7F) is used to disable generation of the ion beam in response to sensed conditions. In the event the digital signal processor 105 senses a failure in the scanning motor and/or transmission coupling motion at the motor to the wafer support, it can generate an output signal at the output 254 which communicates with scan electronics for scanning the beam from side to side. Since the processor 105 is capable of detecting a catastrophic failure due to a failure in the motor and/or transmission, it is important that this failure be used immediately to de-activate the scan. This allows the failure to be corrected and the scan position to be recorded.

Software Control Algorithm

Figure 4:
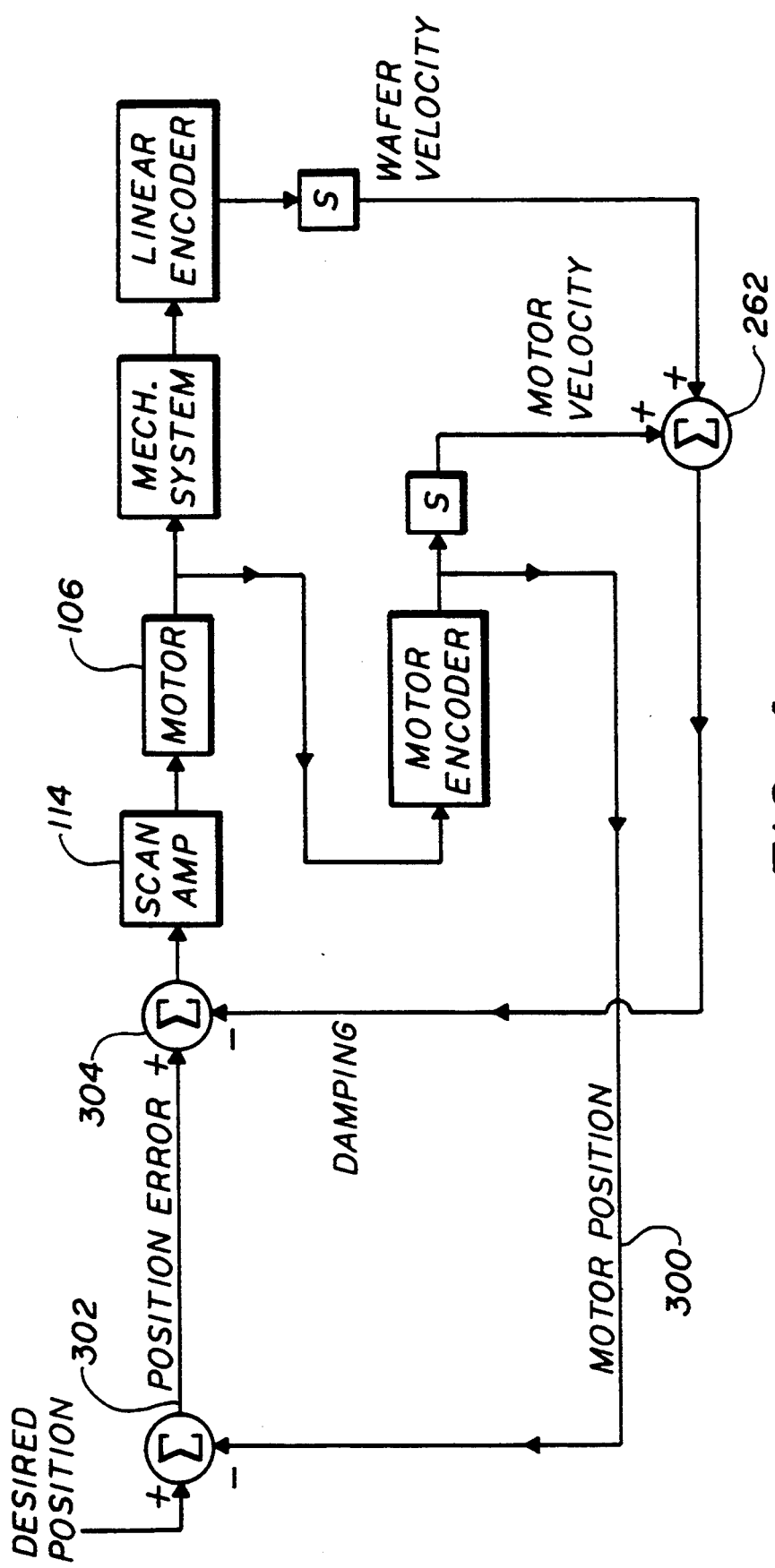
FIG. 4 is a schematic illustrating a double loop correction feedback process for monitoring position and speed during an ion implantation and performing real time updates of motor energization signals during an ion implantation scan.
Figure 5A:
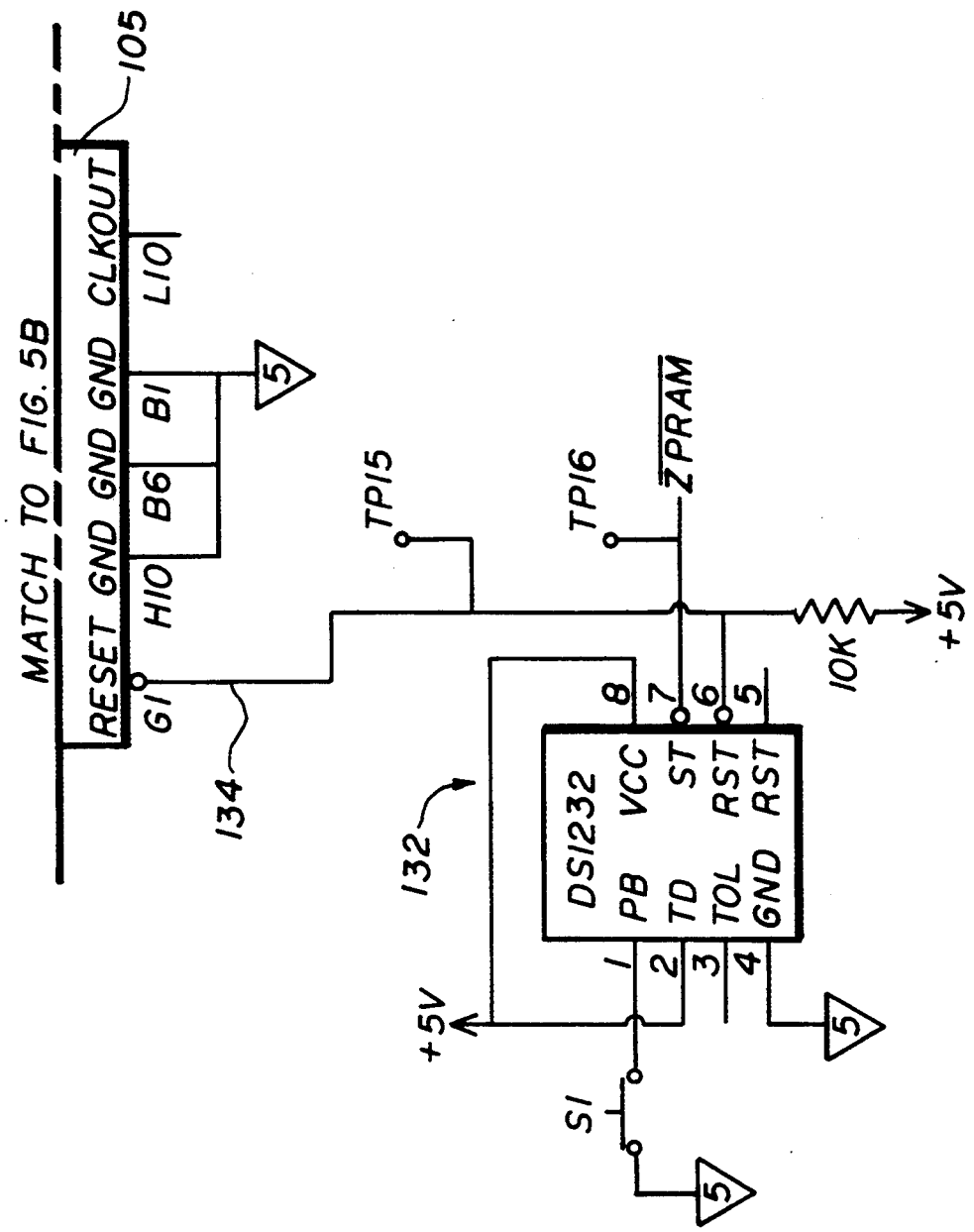
FIG. 5 is an overview of FIGS. 5A–5H which are detailed schematics of a digital signal processor programmed to monitor inputs and control the scanning output provided by a motor.
Figure 5B:
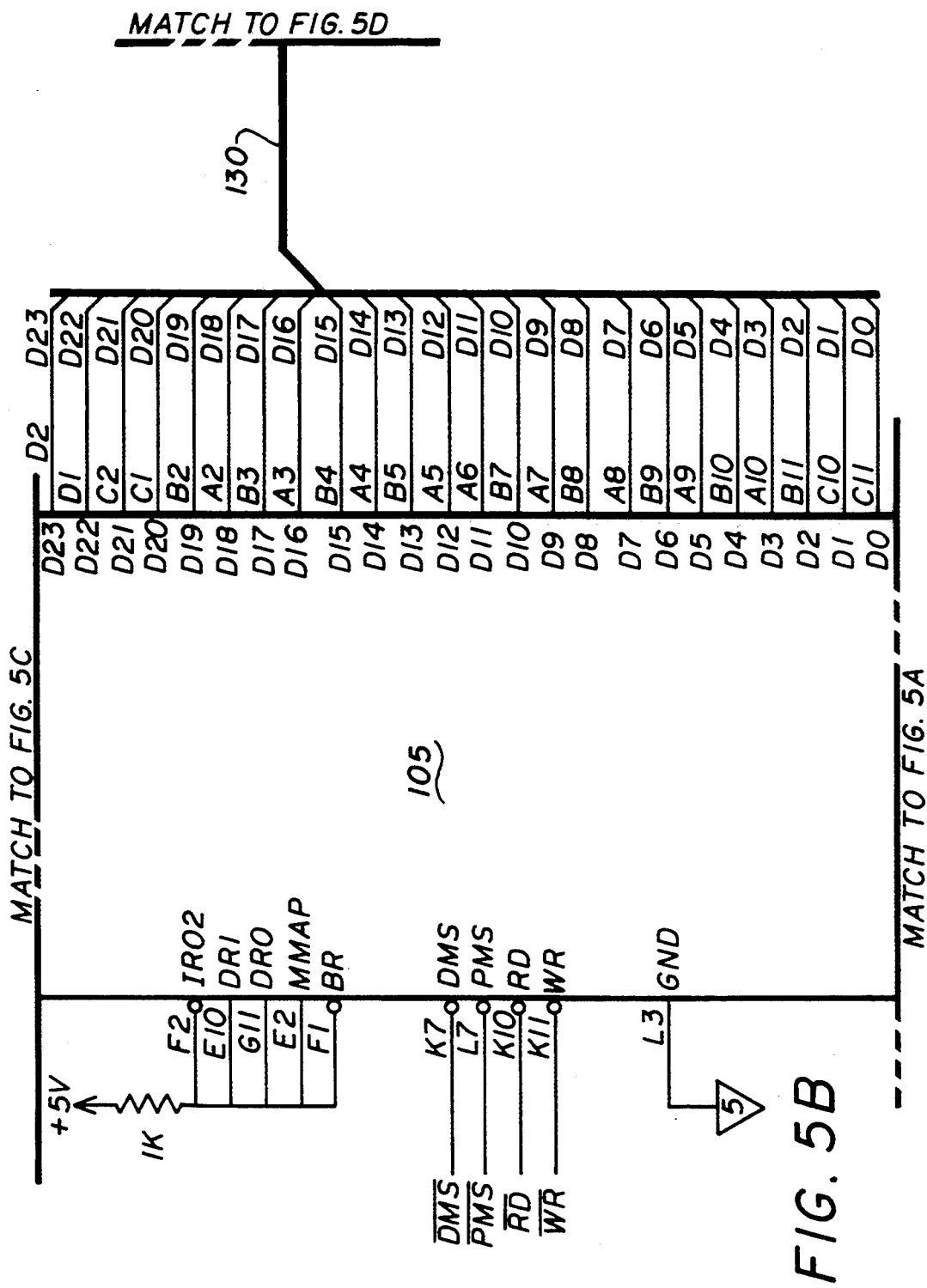
Figure 5C:
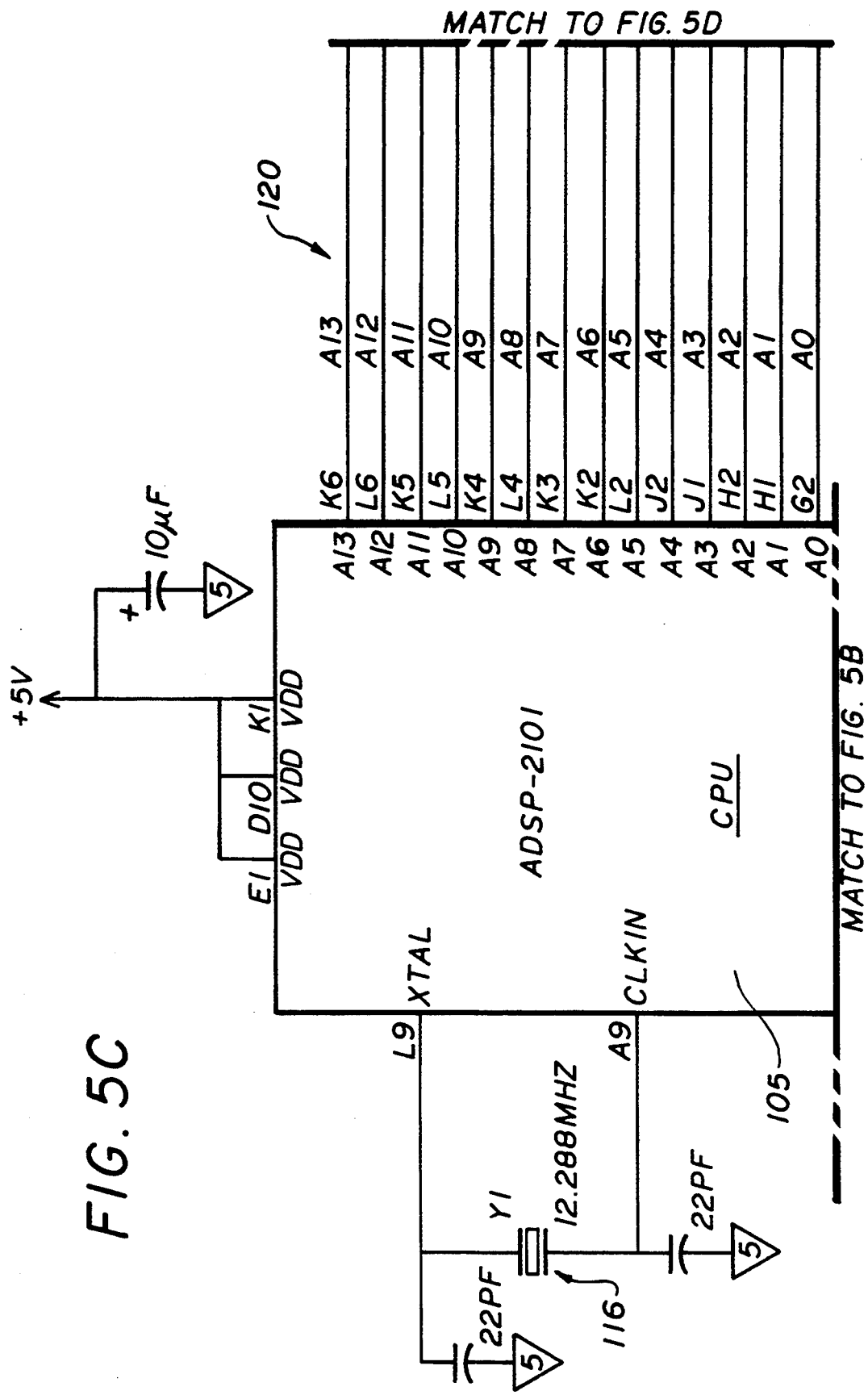
Figure 5D:
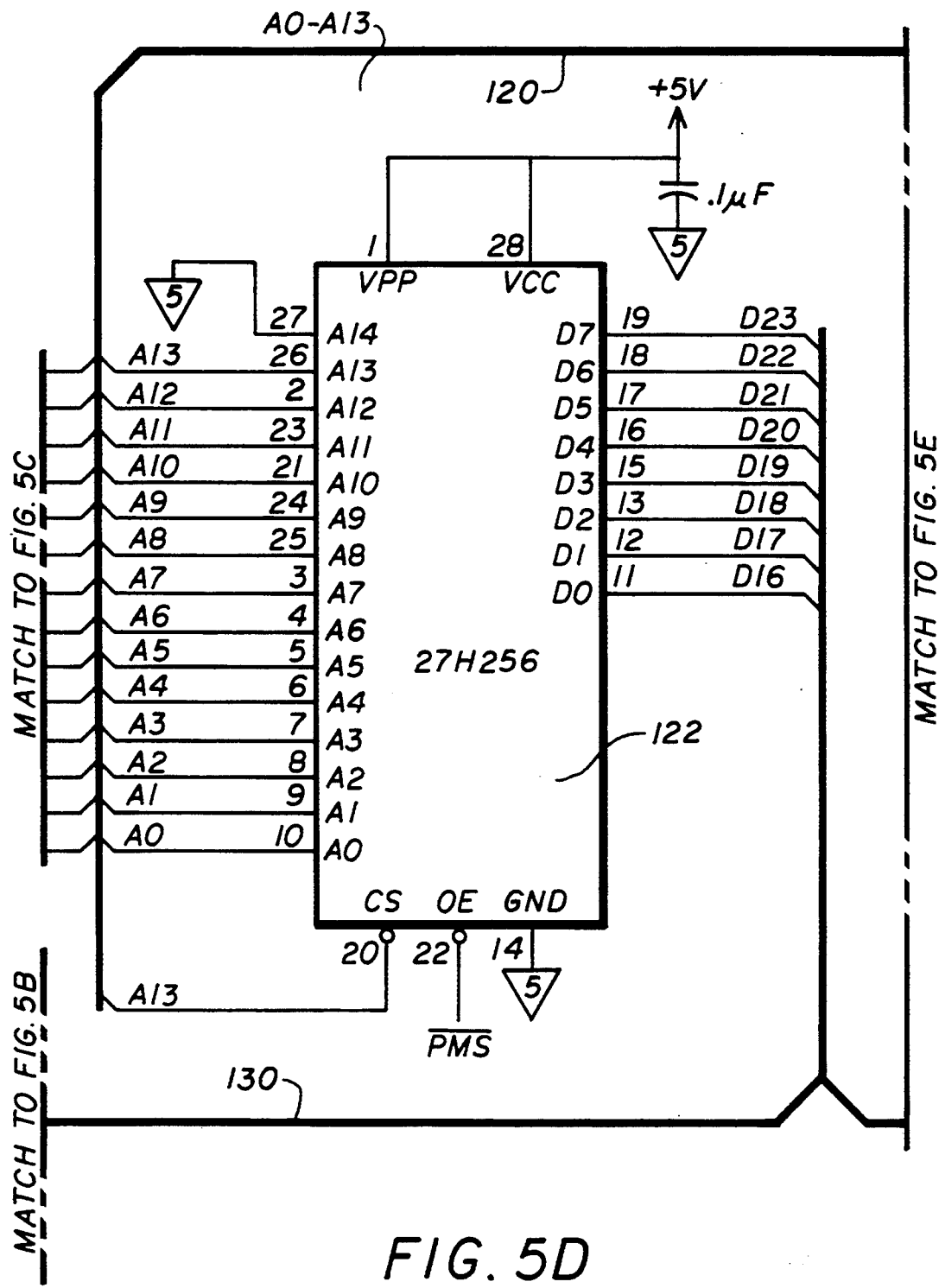
Figure 5E:
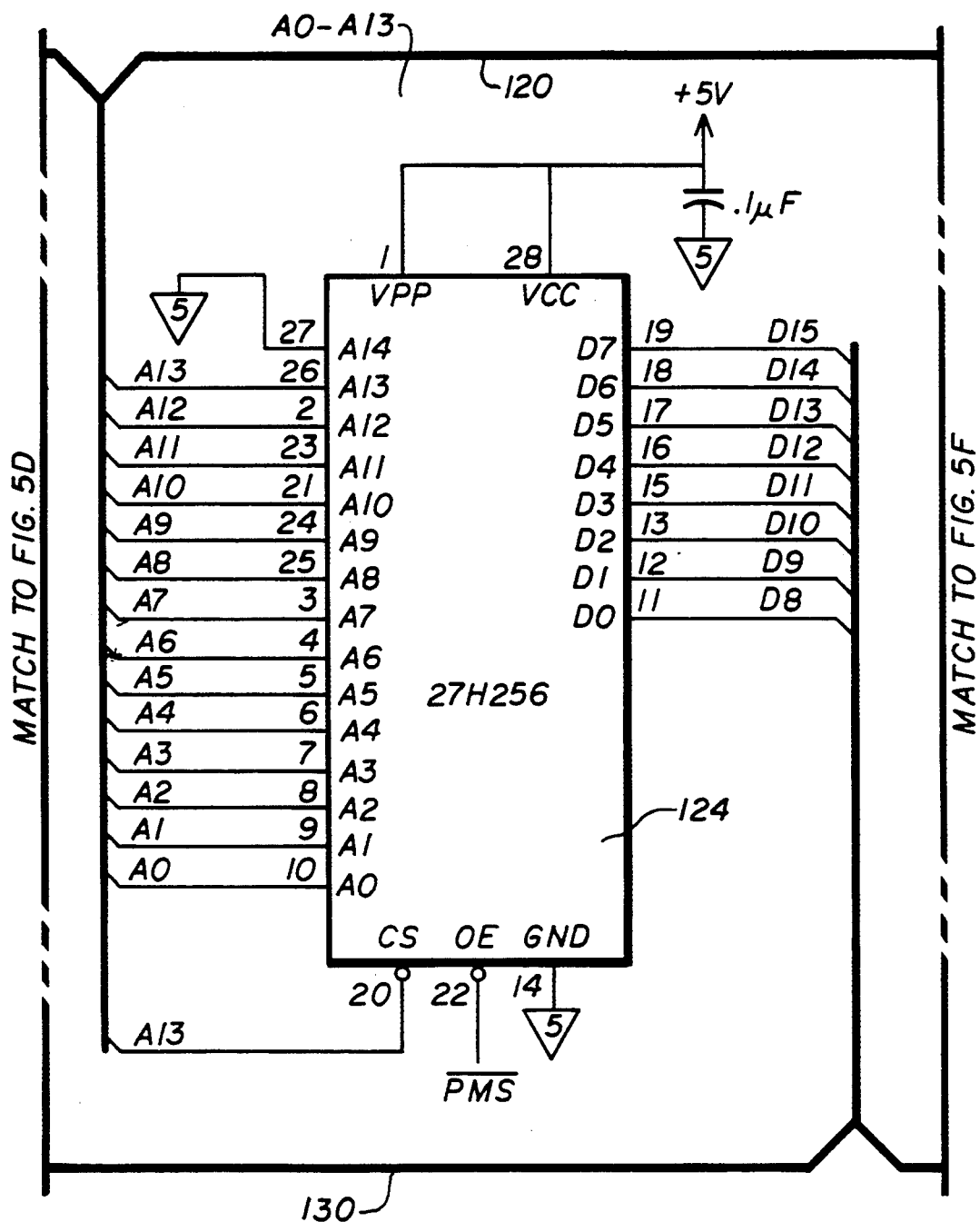
Figure 5F:
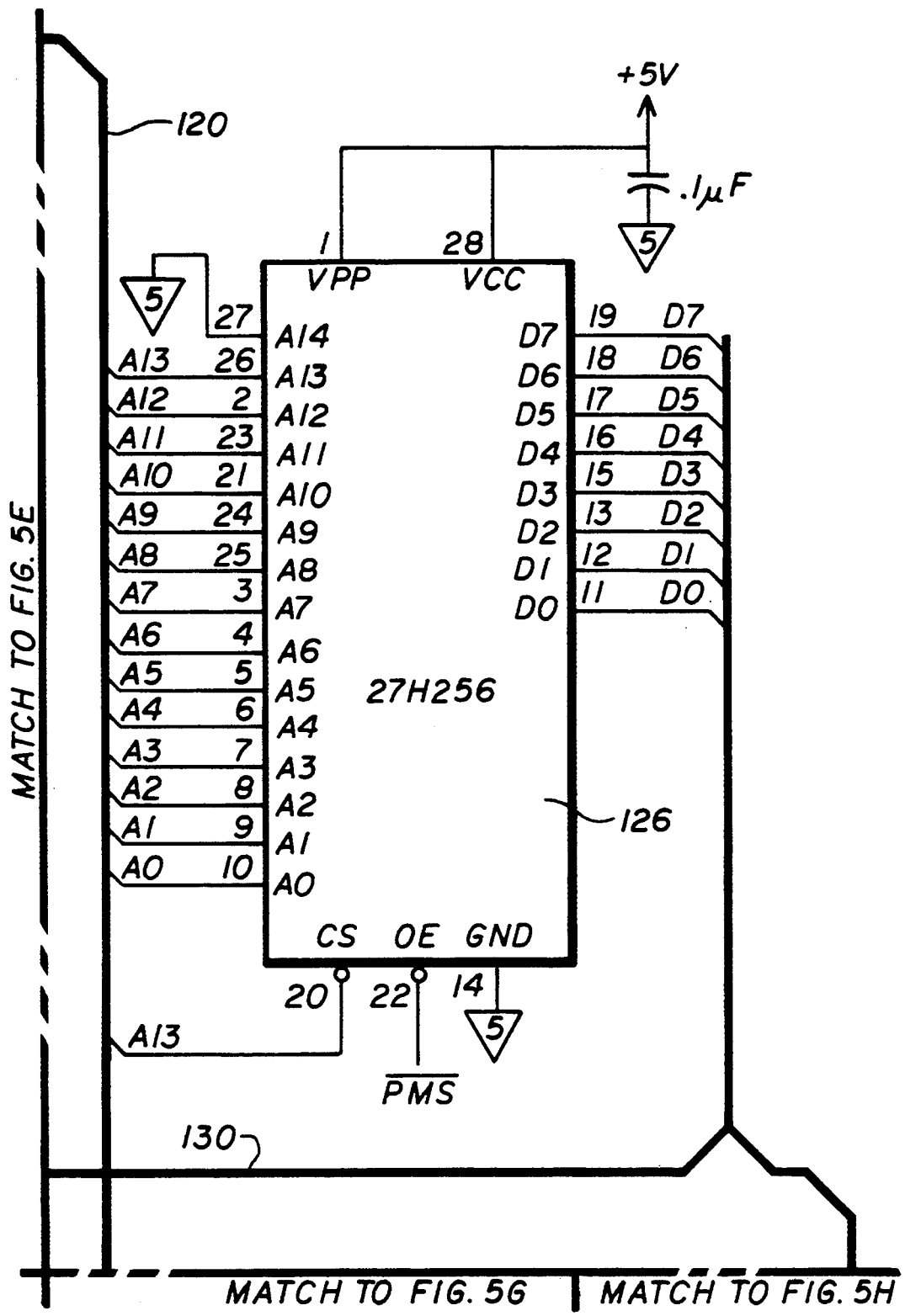
Figure 5G:
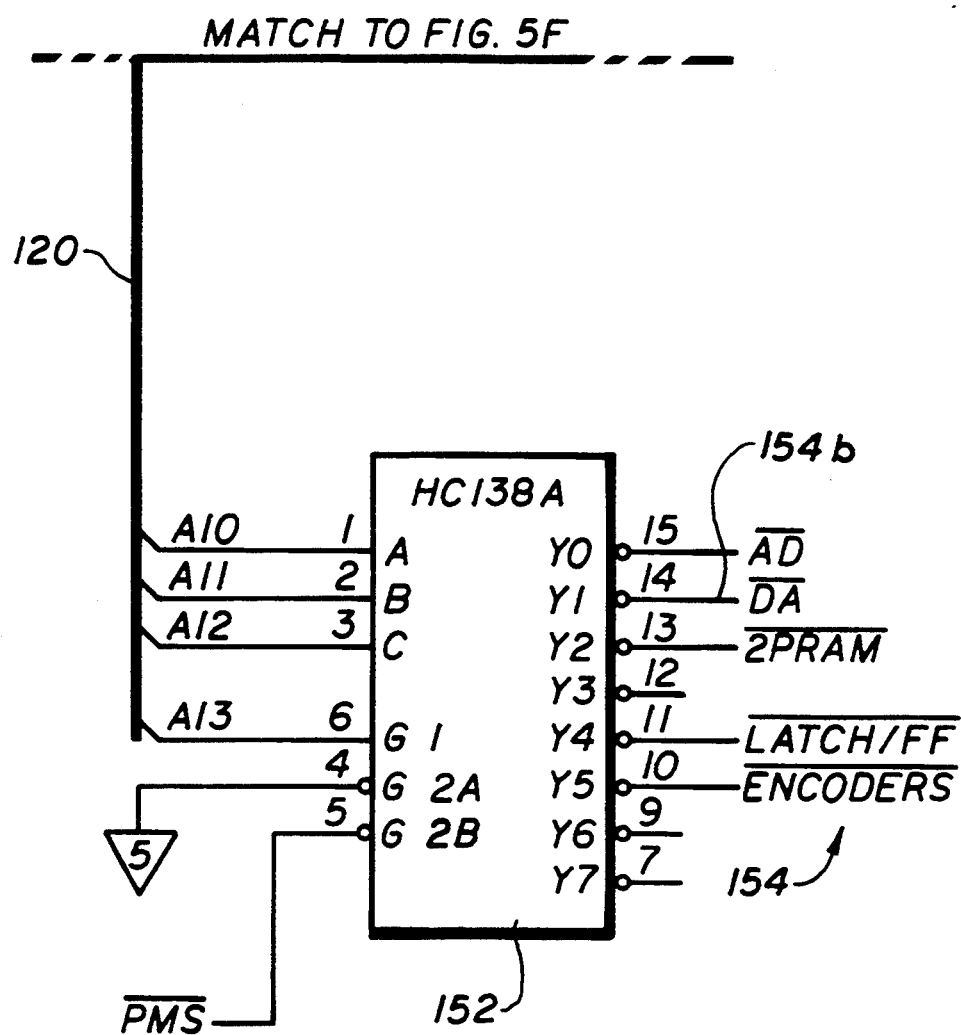
Figure 5H:
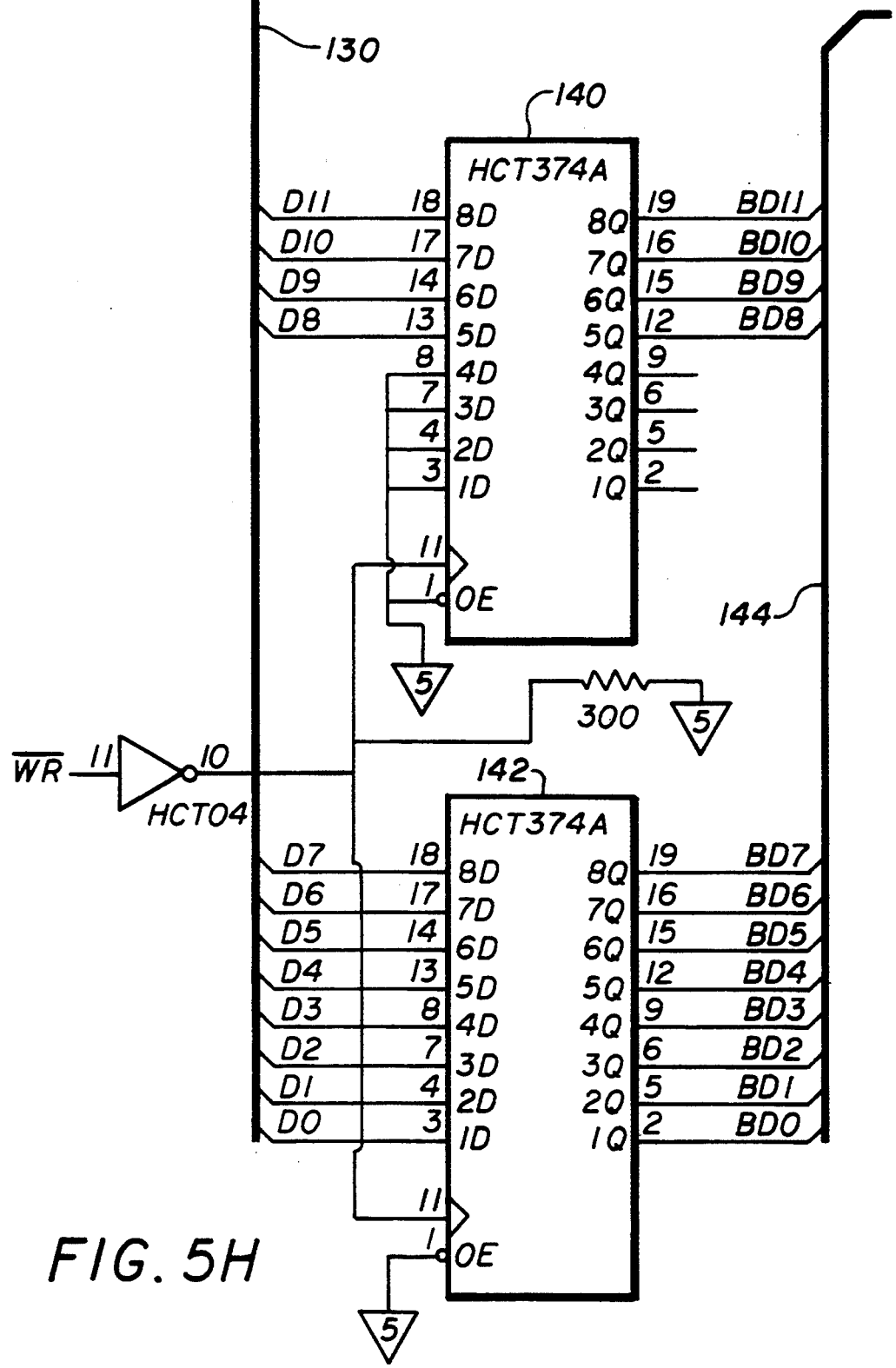

The processor motor energization scheme is outlined in schematic form in the dual loop feedback control scheme shown in FIG. 4. This schematic shows the DC brushless motor 106 and scan amplifier 114 for activating the motor coupled to an output which corresponds to the output from the digital-to-analog convertor 150. This output is calculated by the digital signal processor based upon a desired position which is stored within the processor and information fed back from the linear encoder and motor encoder, respectively. Weight and cost considerations prohibit making the scanning system perfectly rigid. Some flexibility is tolerated within the transmission 107 between the motor shaft and scan support. This makes it impossible to directly servo the motor to achieve a linear scan, hence the need to provide a feedback adjustment to the motor activation based upon sensed motion.

The controller 102 operates using a double feedback loop control shown in FIG. 4. A first loop feedback signal 300 is calculated based upon the output from the motor encoder which is directly related to the shaft orientation of the motor. As the motor is activated and the motor encoder 112 produces an output signal related to shaft orientation, this signal is used by the digital signal processor 105 to provide a position error output signal 302 based upon a desired position. This is a first order correction which will be applied by the processor to the programmed motor energization sequence coupled to the digital-to-analog convertor 150.

In addition to a signal loop correction, the disclosed system includes a second feedback control wherein signals corresponding to the position of the wafer support and motor are converted to velocity information within the processor 105 and combined by the processor at a summing step 304 to provide a second correction factor to the first order correction signal applied to the servo amplifier 114. This second correction factor actively damps out vibrations in the system caused by motor energization or other disturbance and produces a smoother scanning motion than would be achieved by a single feedback control loop based upon deviations between sensed and desired wafer position.

If the scan motor were to turn at a constant angular rate throughout its scan, the wafer support would slow down slightly at the extremes of travel due to a triangular geometry of the scan arms of the transmission 107 connecting the motor to the support. Since the linear encoder is not used to servo control the motor position, this effect is not taken out by the two servo loops. The wafer support position is therefore proportional to the sine of the motor angle times the effective length of the scan arm. If uncorrected, this would induce a large velocity error.

It is possible to employ an arcsine approximation to convert linear position to motor position when the desired position is fed into the servo loop. However, due to machining and tolerance errors, belt stretch and so forth, the scan arms do not behave as a perfect triangle and this technique still yields an error of about 0.5%.

The processor 105 corrects for this scan geometry by measuring the geometry of the scanning system during an initialization process, and building an internal table which correlates motor position with wafer support position. This is accomplished as follows: On power-up or re-initialization, the motor controller 102 first moves the support 42 to a center position using the home sensor. Then it moves the support (in an implant tilt position) from one extreme of travel to the other. During this test scan, it samples position from the linear encoder 110 and stores the samples in a table indexed by motor position. Then, after the measurement is complete, this table is reverse indexed, so that another table is built of motor position indexed by linear scan position. Linear interpolation is used to approximate values that lie between sample points. The second table is used to convert target wafer support position to current wafer position (again, using linear interpolation). This technique reduces the velocity error to below measurable amounts. It also serves as a self-diagnostic to detect problems with the scan mechanism, such as a loose belt or broken bearing. Such problems show up as step functions in the linearization table.

Conventional trajectory controls for servo motors use so-called trapezoidal velocity profiles, where the velocity ramps linearly up or down to a target velocity. The acceleration profile is rectangular. For a mechanical system that is sensitive to self-induced vibration, the transition from zero acceleration to maximum acceleration ("jerk") causes vibration of the system, even for very low values of acceleration.

Figure 11:
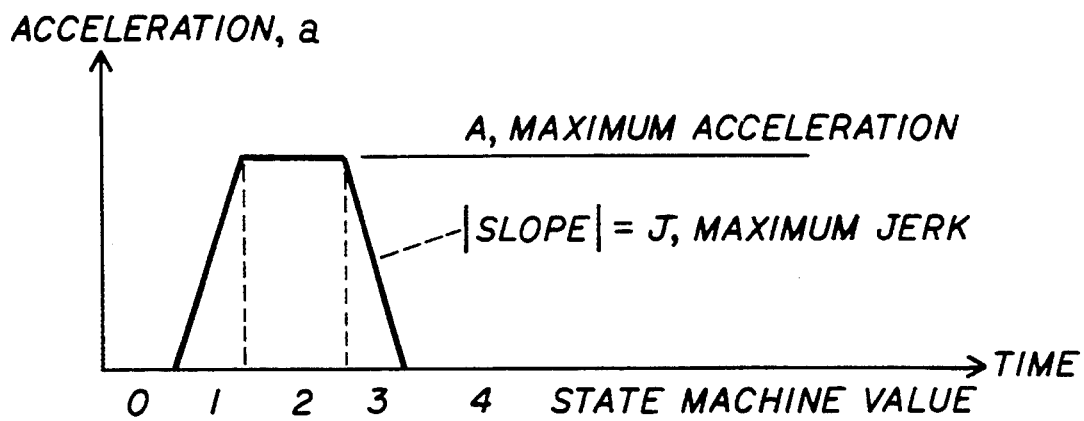
FIG. 11 is a graph of acceleration vs. time showing a rapid increase in acceleration followed by a period of steady acceleration and then decreasing acceleration.
Figure 12:
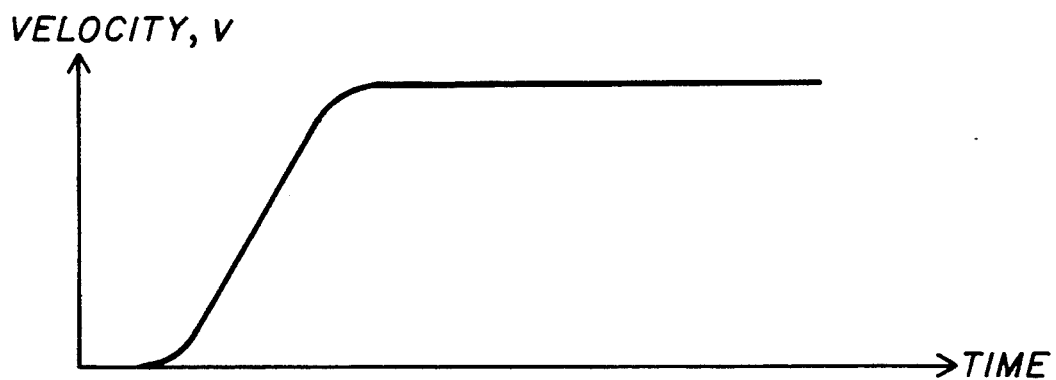
FIG. 12 is a graph of velocity vs. time for an increasing acceleration portion of the FIG. 11 acceleration graph.

To reduce this effect, the processor 105 uses s-curve velocity profiles, or trapezoidal acceleration profiles (see FIGS. 11 and 12). These profiles limit the jerk to a maximum value. During a change in velocity, the acceleration is ramped up to a maximum, and then ramped down again while the velocity approaches its desired value. While it is considerably more complex to calculate the time at which to start the acceleration to achieve the desired final position of the motor, the s-curve profile reduces vibration in the system due to abrupt changes in velocity (such as reversing direction at the end of a scan).

Since the ion beam will, in practice, vary in current during the implant, the scanning speed must be locked to the beam current. The beam current is measured by the end station controller, and multiplied by a factor which is calculated to yield a given dose per unit area. During the implant, the result is transmitted periodically (80 times a second in the present system) to the processor 105, which updates the desired velocity subject to the maximum acceleration and jerk limitations.

FIGS. 9 and 10 are flow charts documenting the computer program that is executed by the digital signal processor 105 in implementing the double loop feedback control and motor energization. These listings are for the disclosed digital signal processor. Similar algorithms would be needed for alternate processors.

All of the processing by the motor controller 102 is performed on an interrupt basis. Two periodic interrupts are used, a timer interrupt and a motor interrupt. The timer interrupt occurs at a rate that is an integer multiple of the serial communications bit rate, 9600 hertz in the preferred embodiment of the invention. The flow diagrams for the two interrupt service routines are shown in FIGS. 9 and 10.

Figure 9A:
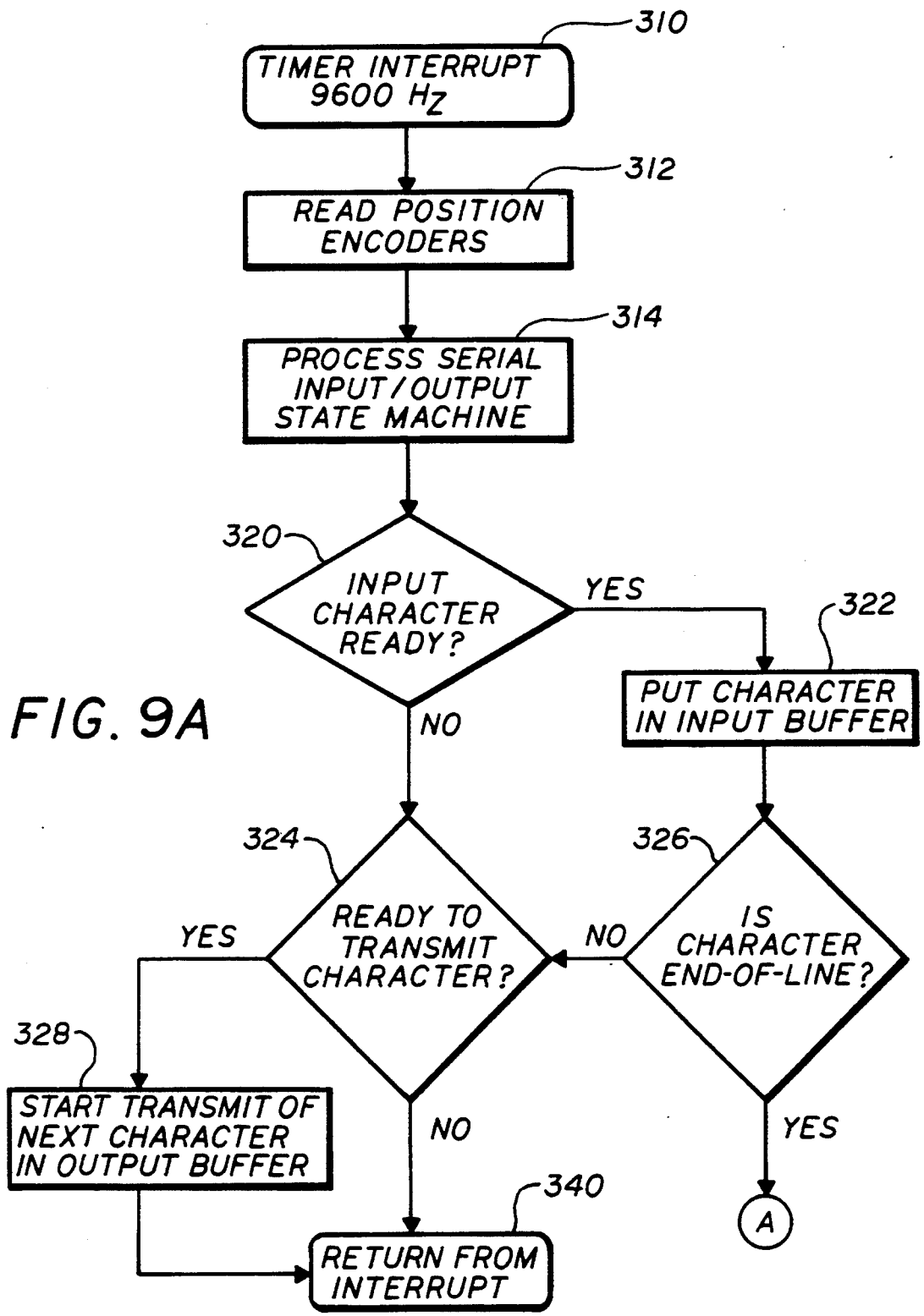
FIGS. 9A, 9B, 10A, 10B and 10C are flow control diagrams that describe a control algorithm for scanning a wafer through an ion beam.
Figure 9B:
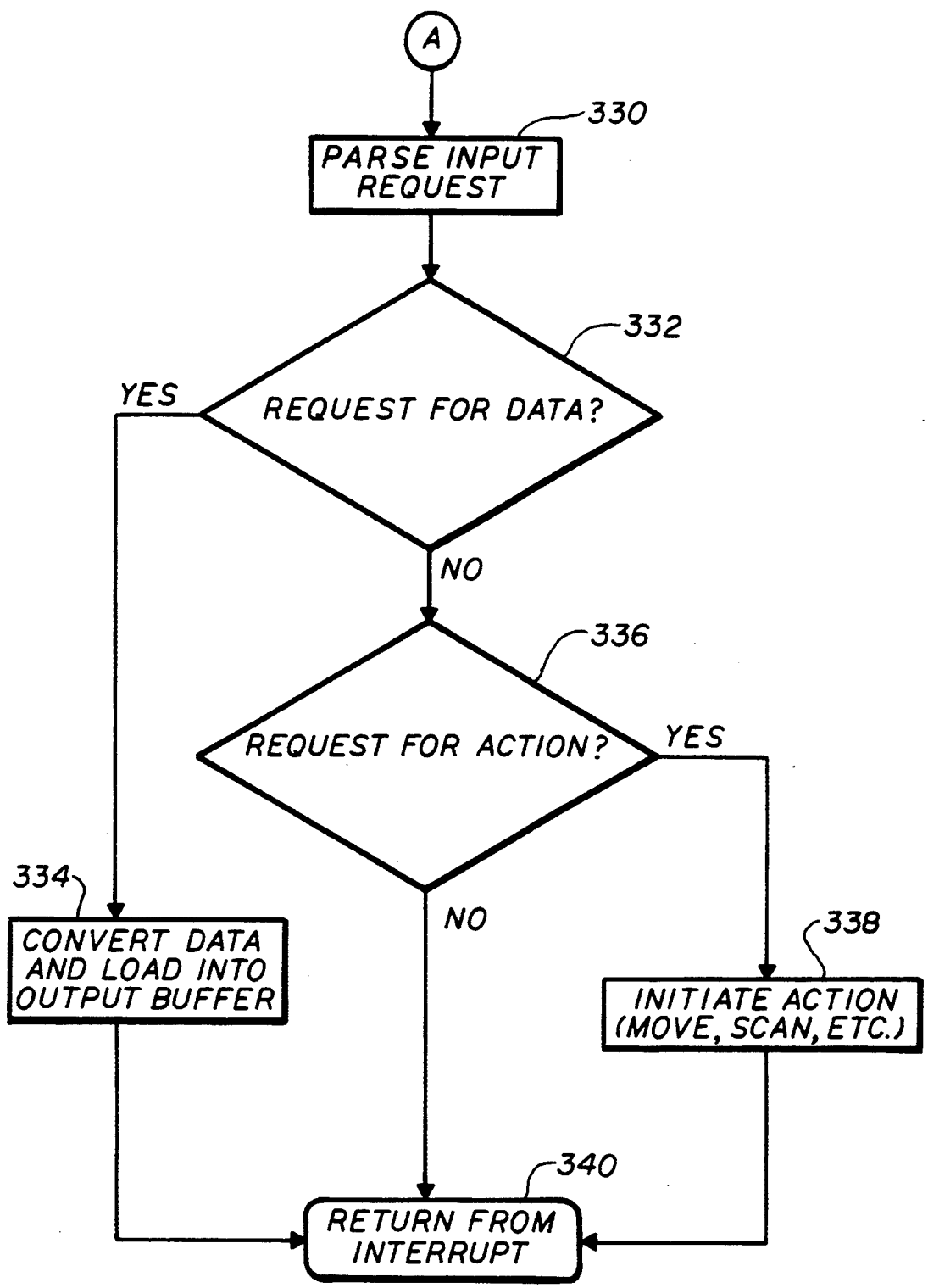

Referring to FIGS. 9A and 9B, the steps shown in the flow diagram are performed by the controller's processor 105 each time a timer interrupt 310 occurs. In response to receipt of a timer interrupt 310, the processor reads 312 the motor 112 and wafer support 110 encoders. Any overflow of the hardware encoder counters is carried over to internal counters in random access memory. The previous reading of each encoder from the previous interrupt is also saved to facilitate velocity calculations performed by the processor 105.

The processor next processes serial input or output data communications at a step 314. Since the processing of such communications protocols are well known in the prior art the steps in acquiring and sending data are not discussed in detail. In the preferred embodiment of the invention the data communications processing is performed in software but could also be performed in hardware.

Requests for actions to be performed or requests for data are sent to the processor 105 by means of the serial communications line 104. At the step 320 the processor 105 determines whether a character has been received at the input buffer. If no data has been received the controller determines 324 if a character is ready to be sent. If no data is received and no data is ready to be sent the processor returns 340 from the interrupt.

If, at the step 320, the controller determines that a character has been received at the serial input latch 220 (FIG. 7B), it gets the character at step 322 and checks 326 to determine if the character is an end of line character. If it is not an end of line, then the processor 105 merely stores the character and branches to a step 324 to see if a character is ready to be sent to the implant controller from the serial output latch 240. If a character has been put into the output buffer for transmission the processor sends it 328. Examples of data that can be sent by the controller 105 are encoder positions, target positions, and the settings of control parameters.

If the controller 102 has received an end-of-line character, the controller parses 330 the contents of its input buffer to evaluate the data. One possibility is that a request for data has been received from the implant controller. If the controller determines 332 that a request for data has been received the data is converted into an appropriate form and loaded 334 into an output buffer for serialization and output via the latch 240.

Another possible request that could be received by the processor 105 is a request for an action. If the processor 105 determines 336 the request is a request for action, the controller initiates the action 338 and, after performing the action, the processor returns 340 from the interrupt. If the end of line character does not correspond to a request for action or a request for data the controller 105 returns 340 from the interrupt.

There are many possible requests for action. The controller 105 can set a control parameter to a desired value (for example to maximum acceleration), initiate a movement or scan of the wafer, build a linearization table to convert wafer support position to motor position, stop a movement or scan, change the scan velocity in the middle of a scan, or reset the processor 105.

Figure 10A:
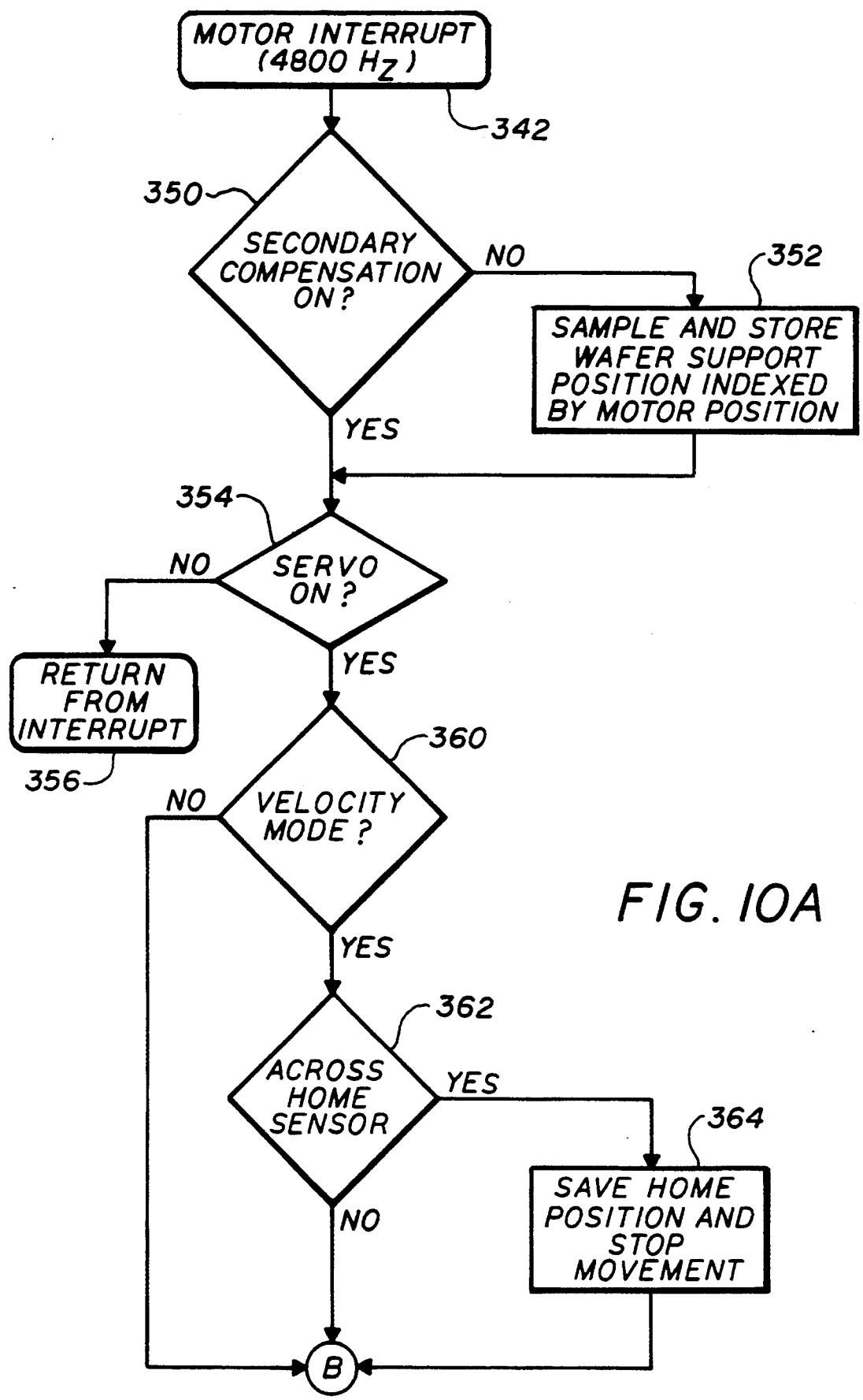
Figure 10B:
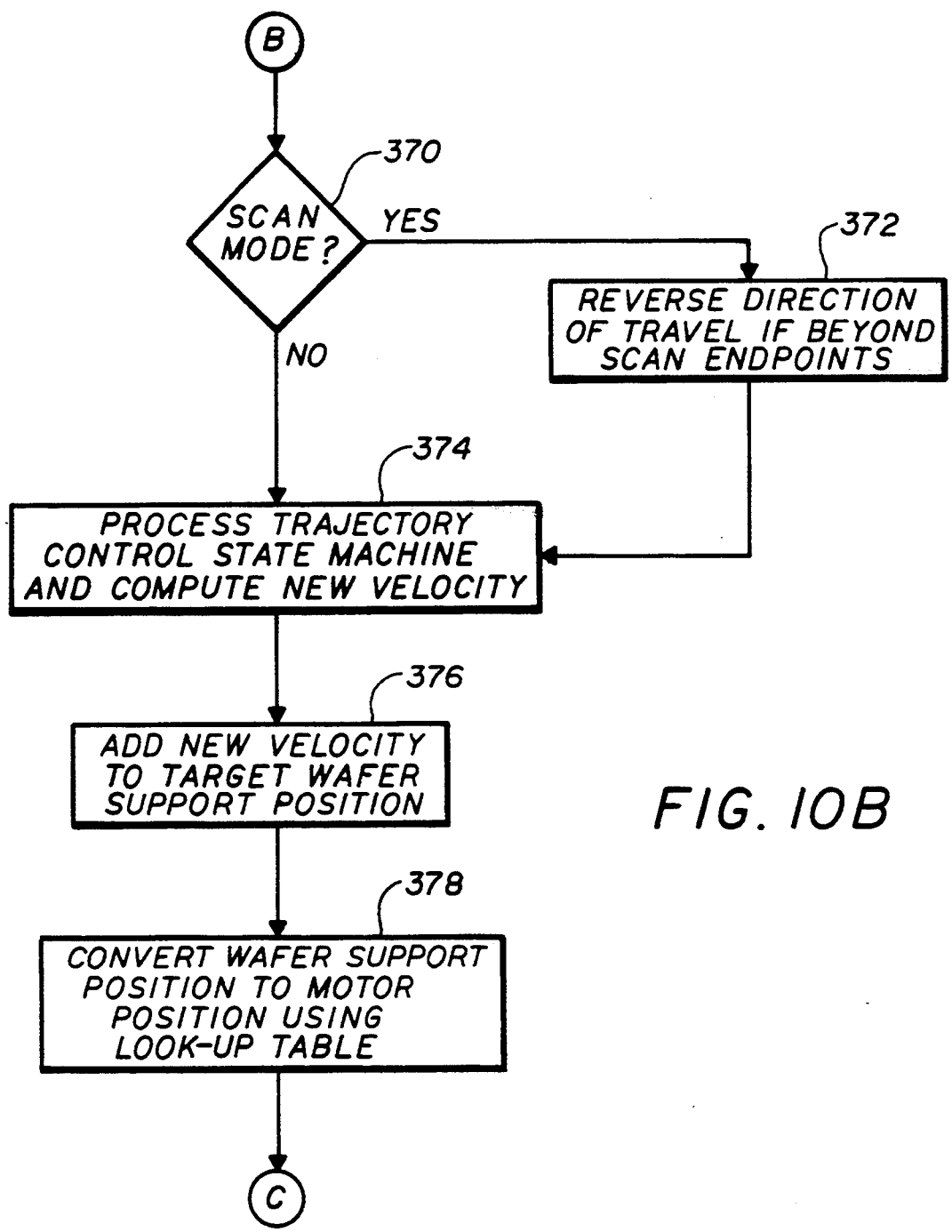
Figure 10C:
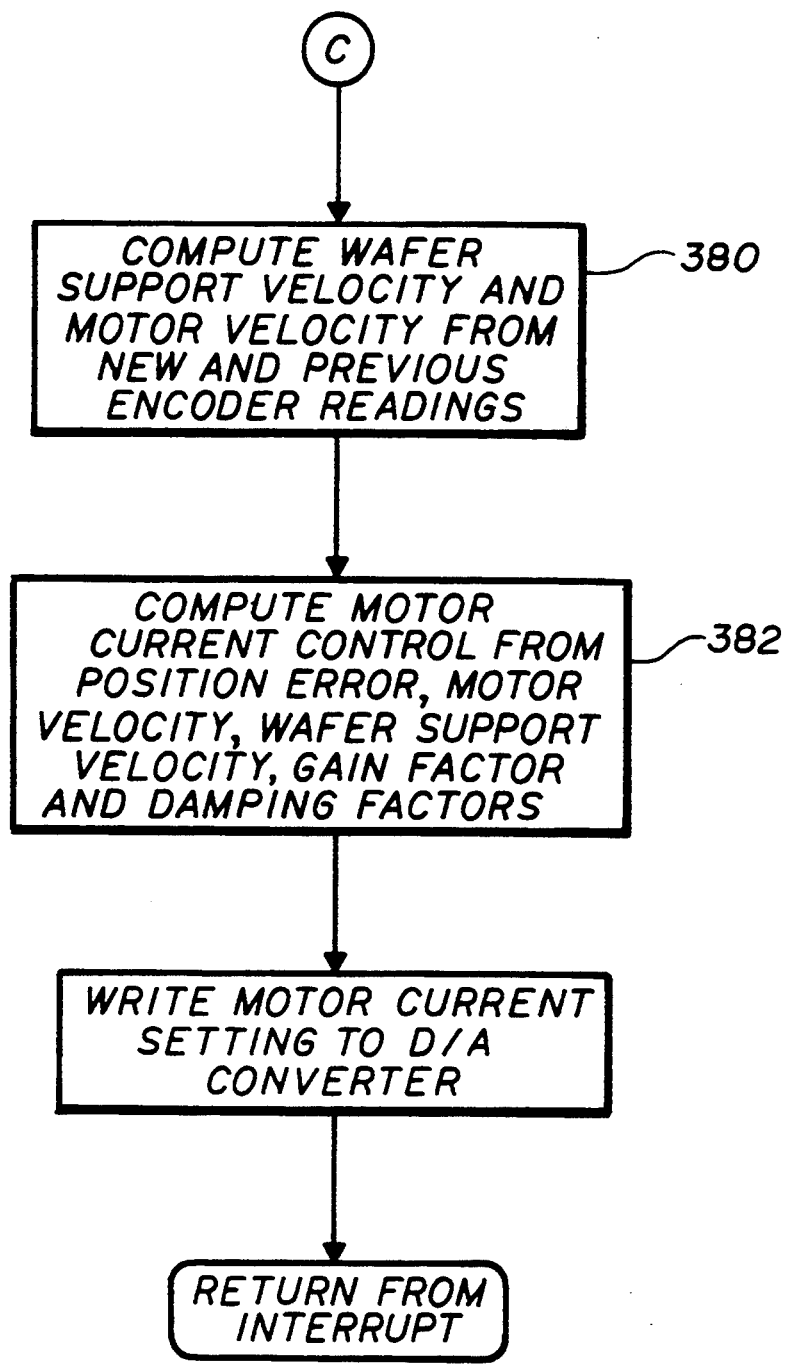

FIGS. 10A–10C illustrate a flow control diagram for the processor response to receipt of a motor interrupt 342. At a first step 350 the controller determines if secondary compensation is turned off. The secondary compensation is turned off when the controller has not yet built a linearization table and is still going through the process of initialization.

If the controller is still in the process of initialization, the controller responds to the interrupt 342 by sampling wafer position sensed by the linear encoder 110 and storing 352 the wafer support position in a table that can be indexed by motor position.

If secondary compensation is on, the processor 105 determines 354 if a servo loop control is on. If the position servo loop is turned off, then the controller returns 356 from the interrupt 342 and then waits for the next interrupt. If the controller determines 360 the motor control is in velocity mode (meaning that the motor is being turned continuously at a set velocity, without an ending point) and the home sensor has changed state 362, the motor position is saved and the motion is stopped 364. This saved position is used during initialization to find the center or home position of the support 42.

If the controller determines 370, it is in scan mode (meaning it is scanning the wafer back and forth under the ion beam), then the direction of travel is reversed 372 if the wafer support position is beyond the limit of travel for wafer scanning. At a next step 374, the s-curve trajectory control state machine is processed. The formulas used for the s-curve trajectory control are derived from integrating the areas under ideal acceleration and velocity curves shown in FIG. 11. These formulas are determined as follows:

The velocity v is added into the target position, or desired position, every motor interrupt, which in the preferred embodiment of the invention is 4800 times a second. The sign of the velocity is reversed before adding if the direction of travel is reversed. This means all further calculations normally have positive results. The state machine controls the phase of trajectory control. The states are:

0—still
1—accelerate at maximum positive jerk
2—accelerate with zero jerk
3—accelerate with maximum negative jerk
4—cruise (no acceleration, i.e., constant velocity)
5—decelerate at maximum positive jerk
6—decelerate with zero jerk
7—decelerate at maximum negative jerk The current acceleration a is added to the velocity v, during states 1, 2 and 3, every motor interrupt. The acceleration is subtracted from the velocity v during states 5, 6 and 7, also every motor interrupt. At the start of a move (state 1), the acceleration a is increased by the maximum jerk J every motor interrupt. Then a check is made if the present acceleration exceeds the maximum acceleration A. If so, the state is changed to 2 and the acceleration is set to A (the maximum).

In state 1 or 2, a check is made every motor interrupt to see if the next state (3) should be started to bring to an end the acceleration period. This is true if the minimum further velocity change (the change which would be caused by present acceleration decreasing by the maximum jerk) is greater than or equal to the desired velocity change $V_{delta}$, or $$v_\delta < a^2/2J \qquad \text{Eq. (1)}$$

To avoid the costly division operation the processor 105 instead computes this inequality as $$2Jv_\delta < a^2 \qquad \text{Eq. (2)}$$

If the inequality is true, then the state is advanced to 3 and the acceleration begins decreasing.

In state 3 the acceleration is decreased by J each motor interrupt. If the result is less than or equal to zero, then the acceleration is set to zero and the state is changed to 4. During state 4, the final position is checked against the present position to determine when to start the deceleration (state 5). To calculate the distance traveled from decelerating from an initial velocity V, to zero velocity, and at a maximum acceleration A and a jerk of J, the following is first calculated:

$$VJ - A^2 \qquad \text{Eq. (3)}$$

If this value is less than zero, then the acceleration profile is triangular (meaning there is no period of zero jerk), otherwise it is trapezoidal (meaning the middle portion of the acceleration profile is flat, i.e., when jerk is zero). For a triangular profile, position change P is calculated as:

$$P = \sqrt{(V^3/J)} \qquad \text{Eq. (4)}$$

and for trapezoidal profile, P is calculated as:

$$P = (V^2/A + AV/J)/2 \qquad \text{Eq. (5)}$$

If P is greater than or equal to the absolute difference D between the present position and the desired stopping point, then the deceleration must be started immediately.

In the preferred embodiment of the invention, these calculations are carried out in a somewhat different form to save calculation time and to take advantage of constant factors. The constants $$k_1 = 2AJ \qquad \text{Eq. (6)}$$

$$k_2 = A^2 \qquad \text{Eq. (7)}$$

are calculated only once, when the move is started.

During state 4, the following are computed every motor interrupt: The triangular profile calculation is selected if the inequality $$VJ < k_2 \qquad \text{Eq. (8)}$$

is true (from Eq. 3 above). For a triangular profile, the deceleration is started when the following inequality is true:

$$D^2 J < V^3 \qquad \text{Eq. (9)}$$

(from Eq. 4 above) and for a trapezoidal profile, the deceleration is started when the following inequality is true:

$$2AJD < JV^2 + A^2 V \qquad \text{Eq. (10)}$$

or $$k_1 D < JV^2 + k_2 V \qquad \text{Eq. (11)}$$

which is derived from Eq. 5, 6 and 7. The calculations for ending states 5, 6 and 7 of the state machine as the same as for states 1, 2 and 3, respectively.

Turning back to the FIG. 10B flow chart, after the trajectory control state machine is processed 374, the resultant velocity is added 376 to the target wafer support position, this target position is converted 378 to a target motor position using the linearization look-up table. The art of linear interpolation for discrete tables of arbitrary functions is well known in the prior art.

The encoder values read at the step 312 (FIG. 9) are used to calculate 380 the instantaneous velocity of the motor and the wafer support. The velocity $V_w$ for the wafer support is filtered with a simple digital FIR filter to reduce noise. The motor current (i.e., the voltage level passed to the servo amplifier) is then calculated 382 as follows:

$$I = GP + D_1 V_m + D_2 V_w \qquad \text{Eq. (12)}$$

Where I is the motor current, G is the gain factor, P is the position error computed as target motor position minus actual motor position, $D_1$ is the motor damping factor, $V_m$ is the motor velocity, $D_2$ is the wafer support damping factor, and $V_w$ is the filtered wafer support velocity. The values for G, $D_1$ and $D_2$ are empirically determined and are usually set through the implanter operator's console during manufacturing test of the ion implanter.

While the present invention has been described with a degree of particularity, it is the intent that the invention include all modifications and alterations from the disclosed embodiment falling within the spirit or scope of the appended claims.

I claim:

1. In an ion implanter that treats a wafer by scanning the wafer through an ion beam, a method for controlling a relative movement between the wafer and the beam comprising the steps of:
   a) coupling a motor to a wafer support by means of a transmission that converts rotary movement of a motor output shaft to translational movement of the wafer support;
   b) activating the motor to provide a scan of the wafer through an ion beam impinging onto the wafer;
   c) monitoring a position of the motor shaft to provide a first position signal and monitoring a position of the wafer support to provide a second position signal;
   d) comparing the first position signal with a target motor position signal to produce a position error signal for energizing the motor;
   e) determining instantaneous motor shaft velocity and wafer velocity based upon the first and second position signals as the motor scans the wafer through the ion beam;
   f) modifying the position error signal with a damping correction factor based upon the shaft and wafer velocities and using the modified position error signal to energize the motor.

2. The method of claim 1 wherein the target motor position signal is interpolated from a table of motor positions versus wafer support positions stored in a memory of a programmable controller in the form of multiple desired wafer support positions.

3. The method of claim 2 wherein a target wafer velocity is used to calculate the target motor position signal and said target wafer velocity is periodically updated based upon sensed ion intensity as a wafer moves through the ion beam.

4. Apparatus for scanning a semi-conductor wafer through an ion beam to controllably treat the wafer comprising:

a) a wafer support mounted for movement along a generally linear travel path to scan a wafer supported by the wafer support through an ion beam;
b) a motor having an output shaft for providing motion to the wafer support;
c) a transmission that couples the output shaft of the motor to the wafer support and converts a rotational movement of the motor shaft to a linear scan of the wafer support to move a wafer through the ion beam at a controlled velocity;
d) a linear encoder that provides signals related to the position of the wafer support as the wafer support moves along the generally linear path;
e) a motor encoder that provides signals related to an orientation of the motor's output shaft;
f) a programmable controller coupled to said linear encoder and said motor encoder for energizing the motor, said controller having a stored program for comparing a target wafer support position with a motor position sensed by the motor encoder to compute a motor energization signal based upon said motor position and target wafer support position; and
g) a programmable controller communications interface for communicating a change in optimum wafer speed to the controller as the wafer is moved through the ion beam to adjust target wafer support positions used by the programmable controller in determining the motor energization signal.

5. The apparatus of claim 4 additionally comprising an interface between the controller and the motor for converting a digital output from the controller to a linear waveform for activating motor windings of said motor.

6. The apparatus of claim 4 where the controller includes means for computing the wafer speed from an encoder input related to the position of the wafer support.

7. The apparatus of claim 4 additionally comprising a sensor for monitoring ion beam intensity and wherein the controller comprises means for adjusting the optimum wafer speed based upon the sensed ion beam intensity.

8. A method of operating an ion implanter that includes an ion source for generating an ion beam, a movable wafer support for positioning wafers within the ion beam, a motor coupled to the wafer support by a transmission that converts rotary movement of a motor output shaft to translational movement of the wafer support through the ion beam, and a controller for activating the motor to provide a scan of the wafer through an ion beam impinging onto the wafers comprising the steps of:
a) monitoring a position of the motor shaft to provide a first position signal and monitoring a position of the wafer support to provide a second position signal;
b) comparing the first position signal with a target position signal to produce a position error signal for energizing the motor;
c) determining instantaneous motor shaft velocity and wafer velocity based upon the first and second position signals as the motor scans the wafer through the ion beam; and
d) modifying the position error signal with a damping correction factor based upon the shaft and wafer velocities to provide a modified position error signal and using the modified position error signal to energize the motor.

9. The method of claim 8 characterized by the step of interpolating target motor position from a table of motor position versus wafer support positions stored in a memory of a programmable controller.

10. The method of claim 9 additionally characterized by the step of updating a target speed based upon sensed ion intensity as a wafer is scanned through the ion beam.

11. An ion implanter for scanning a semi-conductor wafer through an ion beam to controllably treat the wafer comprising a wafer support mounted for translational movement along a travel path to allow the ion beam to impinge upon a time-varying region of a wafer supported by the wafer support, a motor having an output shaft for providing motion to the wafer support, a transmission that couples the output shaft of the motor to the wafer support and converts a rotational movement of the motor shaft to a linear scan of the wafer support to move a wafer through the ion beam; a linear encoder for monitoring a position of the support and providing a first position signal; a shaft encoder for monitoring an orientation of the motor shaft and providing a second position signal; and a controller coupled to the linear and shaft encoders for monitoring the first and second position signals and activating the motor with energization signal based upon a difference between a target motor position and a sensed motor position to achieve a desired scanning speed; said controller including structure for modifying the energization signal by a damping factor based upon velocities of the motor shaft and wafer support calculated by the controller from said first and second position signals.

12. The apparatus of claim 11 additionally characterized by an interface between the controller and the motor for converting a digital output from the controller to an annular waveform for activating motor windings of said motor.

13. The apparatus of claim 11 where the controller is further characterized by means for updating the scan speed from an encoder input related to the position of the wafer support.

14. The apparatus of claim 11 wherein the controller is additionally characterized by a communications interface for receiving a signal related to sensed ion beam intensity and wherein the controller is characterized by means for adjusting the desired scanning speed based upon receipt of the signal related to sensed ion beam intensity.

15. The apparatus of claim 11 wherein the controller is further characterized by means for limiting the rate of change of acceleration of the wafer support applied by the motor as the wafer support is accelerated to a scan velocity.

16. Apparatus for scanning a semi-conductor wafer through an ion beam to controllably treat the wafer comprising:
a) a wafer support mounted for movement along a travel path to scan a wafer supported by the wafer support through an ion beam;
b) a motor having an output shaft for providing motion to the wafer support;
c) a transmission that couples the output shaft of the motor to the wafer support and converts a rotational movement of the motor shaft to a linear scan of the wafer support to move a wafer through the ion beam;

d) a controller for energizing the motor having means for comparing a target wafer support position to a sensed motor position and producing a motor energization signal based upon a difference between the target wafer support position and the sensed motor position; said controller including means for limiting a rate of acceleration of said support as the motor begins and ends a linear scan of the wafer support relative to the ion beam.

* * * * *